United States Patent
Bolis et al.

(10) Patent No.: US 8,879,160 B2
(45) Date of Patent: Nov. 4, 2014

(54) OPTICAL DEVICE WITH DEFORMABLE PIEZOELECTRIC ACTUATION MEMBRANE

(75) Inventors: Sébastien Bolis, Crolles (FR); Stéphane Moreau, Le Chevalon de Voreppe (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/395,169

(22) PCT Filed: Sep. 14, 2010

(86) PCT No.: PCT/EP2010/063427
§ 371 (c)(1),
(2), (4) Date: Mar. 9, 2012

(87) PCT Pub. No.: WO2011/032925
PCT Pub. Date: Mar. 24, 2011

(65) Prior Publication Data
US 2012/0170134 A1 Jul. 5, 2012

(30) Foreign Application Priority Data
Sep. 15, 2009 (FR) ...................................... 09 56327

(51) Int. Cl.
*G02B 3/14* (2006.01)
*G02B 26/08* (2006.01)
*H01L 41/09* (2006.01)

(52) U.S. Cl.
CPC ......... *G02B 26/0825* (2013.01); *H01L 41/0973* (2013.01); *G02B 3/14* (2013.01)
USPC .............. 359/666; 359/579; 396/72; 348/335

(58) Field of Classification Search
CPC .............. G02B 1/06; G02B 3/12; G02B 3/14; G02B 6/3538; G02B 26/004; G02B 26/0825; H01L 41/0926; H01L 41/0973
USPC ......... 359/237–324, 579, 820, 824, 665, 666, 359/667, 676, 677; 351/159.68; 372/94; 396/72–88; 348/207.99, 335, 340, 348/360–361
See application file for complete search history.

(56) References Cited

U.S. PATENT DOCUMENTS

| 4,407,567 A | 10/1983 | Michelet et al. |
| 4,802,746 A | 2/1989 | Baba et al. |

(Continued)

FOREIGN PATENT DOCUMENTS

| FR | 2 919 073 | 1/2009 |
| JP | 8 114703 | 5/1996 |

(Continued)

OTHER PUBLICATIONS

International Preliminary Report on Patentability Issued Feb. 9, 2012 in PCT/EP10/63427 Filed Sep. 14, 2010.

(Continued)

*Primary Examiner* — Darryl J Collins
*Assistant Examiner* — Gary O'Neill
(74) *Attorney, Agent, or Firm* — Oblon, Spivak, McClelland, Maier & Neustadt, L.L.P.

(57) ABSTRACT

An optical device with a deformable membrane including an anchor zone on a support contributing to trapping fluid, a central zone reversibly deforming from a rest position, and an actuating mechanism to displace fluid acting on the membrane in an intermediate zone between the anchor and central zones. The actuating mechanism includes a principal actuation mechanism and supplementary actuation mechanism each arranged in at least one ring mounted around the central zone, each ring including one or plural piezoelectric actuators, and being anchored on the intermediate zone, only the supplementary actuation mechanism may be anchored to the support, these actuation mechanisms and the membrane to which they are anchored forming at least one piezoelectric bimorph, such that they contract or expand in the radial direction during actuation such that when the fluid moves, it deforms the central zone.

38 Claims, 21 Drawing Sheets

(56) References Cited

U.S. PATENT DOCUMENTS

| | | | |
|---|---|---|---|
| 6,188,526 B1* | 2/2001 | Sasaya et al. | 359/666 |
| 7,369,723 B1 | 5/2008 | Mescher | |
| 7,919,362 B2 | 4/2011 | Bolis | |
| 8,072,689 B2 | 12/2011 | Bolis | |
| 8,116,011 B2 | 2/2012 | Bolis | |
| 8,124,439 B2 | 2/2012 | Bolis | |
| 2002/0048096 A1 | 4/2002 | Melzer et al. | |
| 2008/0225379 A1 | 9/2008 | Mescher | |
| 2010/0157438 A1* | 6/2010 | Griffith et al. | 359/666 |
| 2010/0182703 A1 | 7/2010 | Bolis | |
| 2010/0195213 A1 | 8/2010 | Bolis | |
| 2011/0032624 A1 | 2/2011 | Bolis et al. | |
| 2011/0097909 A1 | 4/2011 | Bolis et al. | |
| 2012/0031874 A1 | 2/2012 | Saint-Patrice et al. | |
| 2012/0069450 A1 | 3/2012 | Bolis | |

FOREIGN PATENT DOCUMENTS

| | | |
|---|---|---|
| JP | 2002 243918 | 8/2002 |
| WO | 2007 017089 | 2/2007 |
| WO | 2008 076399 | 6/2008 |
| WO | 2008 100154 | 8/2008 |
| WO | 2010 123920 | 10/2010 |

OTHER PUBLICATIONS

International Search Report Issued Oct. 7, 2010 in PCT/EP10/63427 Filed Sep. 14, 2010.

U.S. Appl. No. 13/394,641, filed Mar. 7, 2012, Moreau, et al.

U.S. Appl. No. 14/098,981, filed Dec. 6, 2013, Moreau, et al.

* cited by examiner

OPTICAL DEVICE WITH DEFORMABLE PIEZOELECTRIC ACTUATION MEMBRANE

TECHNICAL FIELD

This invention relates to an optical device with a deformable membrane trapping fluid and provided with means of actuating the membrane of piezoelectric type to adjust the radius of curvature of the membrane in its central part. Such an optical device with a deformable membrane may be a liquid lens with a variable focal length, a liquid lens with correction of optical aberrations for adaptative optics or a mirror with variable focal length.

For example, liquid lenses can be used in portable telephones with a camera or movie camera function. Many developments are underway, particularly the autofocus function and the zoom function. An attempt is then made to introduce these functions, to obtain the shortest possible response time but also to reduce energy consumption during actuation and to increase the variations in the focal length with a given energy consumption, without making the manufacturing of such cameras complex. More globally, an attempt is made to integrate constituents of these miniature cameras as much as possible in order to reduce costs, dimensions and energy consumption. These miniature cameras operating in visible wavelength are called CCM (Compact Camera Modules). The most advanced liquid lens technology for this application at the moment is the technology based on the electro-wetting principle.

Another application relates to cameras working in the infrared (IR). Progress in terms of integration is not as advanced, and in most cases the optics are dissociated from the cameras. Several developments are underway particularly including the integration of optics (creation of a camera module), integration of the autofocus function, etc. The associated technical solutions are not known at the moment, and need to be defined.

In one deformable membrane mirror application, the membrane is reflecting. An attempt may be made to adjust the focal distance of the mirror and therefore its radius of curvature. Such a mirror can be used in ophthalmology or in adaptative optics. Finally, these optical devices that may be of the lens or the mirror type may be used to stabilise images.

STATE OF PRIOR ART

Patent application FR 2 919 073 discloses an optical device comprising a flexible membrane with an anchor peripheral zone on a support, the membrane and the support trapping a given volume of fluid and piezoelectric actuation means to displace the liquid at the central zone of the membrane in order to deform the central zone of the membrane. The volume is approximately constant within a given temperature range. Actuation means are formed from a plurality of radial micro-beams that are fixed on the support at one end, and the other end of which acts on the membrane in a zone located between the central zone and the anchor zone. One disadvantage of this configuration is that it is not compact because the actuation means bear on the support. Another disadvantage is that the optical performances of the device are not optimal for a given size and a given energy consumption during actuation. Similarly, the energy consumption during actuation for a given dimension and given optical performances is high.

Other patent applications disclose optical devices with piezoelectric actuator means. For example there is U.S. Pat. No. 4,802,746 in which a cylindrical element made of a piezoelectric material is closed at both ends by walls made of an elastic material, the assembly defining a cavity containing a solid elastic material.

In American U.S. Pat. No. 4,407,567, a lens with a variable focal distance comprises a cavity communicating with an expansion chamber, the cavity being delimited by a mobile wall anchored to a support.

International patent application WO 2008/076399 discloses a lens with a variable focal distance in which the piezoelectric actuation means transmit an actuation force approximately normal to the optical axis of the device, to the membrane through a thrust ring that bears on the membrane. Such an optical device is relatively thick because the piezoelectric actuation means, the thrust ring, the membrane and the cavity containing the liquid have to be stacked. The actuation means are not anchored to the membrane.

International patent application WO 2007/017089 discloses an optical device with correction of optical aberrations. A flexible membrane contributes to trapping the liquid. The membrane is provided with piezoelectric actuation means in an intermediate zone located between an anchor zone and a central zone, in the form of a ring broken down into several sectors. Each sector-shaped part will contract or expand tangentially, the forces being applied in a plane approximately normal to the optical axis of the device. Such actuation can deform the membrane locally and non-symmetrically about the optical axis. The membrane can deform, making bumps and troughs around the periphery so as to make it undulating, to correct optical aberrations in the device. Such actuation means are incapable of varying the thickness of the liquid under the central zone of the membrane and therefore varying the focal distance of the optical device.

Patent application WO2008/100154 shows an optical device comprising a cavity containing a gel or elastomer type material closed by transparent covers. Piezoelectric type actuation means cooperate with one of the covers made of glass. The stiffness of this cover tends to reduce the efficiency of actuation and since the material contained in the cavity is a gel or elastomer, it does not provide the required counter action when actuated to deform the central zone of the covers. The centre of the membrane deforms the gel or the elastomer under the actuation effect and this membrane has to be stiff in order to obtain a given deformation. Such an optical device is not very efficient because it is limited in terms of the achievable optical diameter.

PRESENTATION OF THE INVENTION

The purpose of this invention is to provide an optical device with a deformable membrane such as a lens or a mirror that does not have the above mentioned disadvantages, namely size, high energy consumption, and poor actuation efficiency.

Another purpose of the invention is to provide an optical device with a deformable membrane for which the deformed shape of the membrane may be adjusted accurately as required, in which the deformation may or may not be symmetric about an optical axis of the optical device.

Yet another purpose of the invention is to make a lens type optical device that can easily be controlled by very quickly changing from an image stabilisation function to an autofocus function and that can perform these two functions independently of each other.

Yet another purpose of the invention is to make a lens type optical device that, when installed in a camera, can give a zoom function due to an increased optical power.

Yet another purpose of the invention is to provide an optical device with a deformable membrane with active compensation as a function of the temperature so as to keep the same focal distance even if the ambient temperature varies.

To achieve this, this invention proposes that actuation means should be formed from one or several piezoelectric actuators arranged in a ring, anchored to the membrane in an intermediate zone located between a central zone and anchor zone to the support, these actuation means not being anchored to the support either directly or through the anchor zone.

More precisely, this invention is an optical device with a deformable membrane with an anchor zone on a support contributing to trapping a quantity of a liquid or gaseous fluid, a central zone capable of reversibly deforming from a rest position, actuation means for displacing the fluid acting on the membrane in an intermediate zone between the anchor zone and the central zone. The actuation means comprise principal piezoelectric actuation means arranged in at least one ring around the central zone, each ring comprising one or several piezoelectric actuators, and supplementary piezoelectric actuation means arranged in at least one ring around the central zone, each ring comprising one or several piezoelectric actuators, these principal piezoelectric actuation means being anchored only on the intermediate zone of the membrane, these supplementary piezoelectric actuation means being anchored to the intermediate zone and possibly on the support, these principal piezoelectric actuations means, these supplementary piezoelectric actuations means and the membrane to which they are anchored forming at least one piezoelectric bimorph, the principal piezoelectric actuation means and the supplementary piezoelectric actuation means contracting or extending in the radial direction during actuation so as to cause displacement of said fluid from the intermediate zone towards the central zone of the membrane or vice versa in order to deform the central zone relative to its rest position.

The principal piezoelectric actuation means and the supplementary piezoelectric actuation means are preferably actuated independently to perform different functions.

As a variant, they may be actuated simultaneously or one after the other so as to contribute to making a strong change in the focal length to satisfy the requirements of a zoom function.

When the optical device comprises several rings for the principal and/or supplementary piezoelectric actuation means, they are installed to be concentric with each other.

A piezoelectric actuator of the principal and/or supplementary piezoelectric actuation means may be in the form of a continuous ring.

As a variant, the piezoelectric actuators of a single ring may be in the form of ring sectors or radially oriented rods with intervals between each other, the ring being in pieces or continuous.

Several piezoelectric actuators in a single ring or nearby rings may share the same block of piezoelectric material to facilitate technological integration and management of residual stresses.

Supplementary actuation means may be directly or indirectly anchored to the support, which leaves a large amount of latitude during the design of the optical device.

The actuation means may be anchored to one face of the membrane in contact with said fluid and/or on one face of the membrane without contact with said fluid and/or be integrated into the membrane.

The membrane may comprise a reinforcement layer at least locally at the intermediate zone such that the intermediate zone at this reinforcement layer is stiffer than the central zone.

The membrane may comprise a continuous layer at the central zone that occupies the intermediate zone and the anchor zone, which contributes to guaranteeing a good seal.

The optical device may also comprise means of compensating a variation in the focal distance of the optical device as a function of the temperature, so that it can operate without any particular adjustment within a temperature range for example between −20° C. and +60° C.

The compensation means may be coincident with the piezoelectric actuator(s) of a ring.

As a variant, the compensation means may comprise one or several thermal bimorph elements arranged in a ring either anchored to the membrane at the anchor zone projecting onto the intermediate zone, or fixed to the support on the side of the membrane opposite said fluid.

When the actuation means comprise several piezoelectric actuators, they can be actuated separately from each other or all together or they can be actuated simultaneously in groups. This gives greater flexibility to obtain a required deformation of the membrane in the central zone.

According to one advantageous configuration, the actuation means may comprise one or several piezoelectric actuators arranged in a ring with an internal periphery and an external periphery, the ring being prolonged on one of its peripheries through piezoelectric actuators in radially oriented rods.

The optical device may comprise one or several piezoelectric actuators arranged in a ring, anchored to the membrane in the intermediate zone and possibly in the anchor zone, capable of operating passively by direct piezoelectric effect and dedicated to monitoring a deformation of the membrane.

The optical device may also comprise a protective cap fixed on the support. The cap may be provided with an opening at the central zone or it may be leak tight and it may trap another fluid.

The membrane may be made based on organic materials chosen from among polydimethylsiloxane, polymethyl methacrylate, polyethylene terephthalate, polycarbonate, parylene, epoxy resins, photosensitive polymers, silicones (based on mineral materials chosen from among silicon, silicon oxide, silicon nitride, silicon carbide, polycrystalline silicon, titanium nitride, diamond carbon, tin and indium oxide, aluminium, copper, nickel.

Each of the fluids may be a liquid chosen from among propylene carbonate, water, an index liquid, an optical oil or an ionic liquid, or a gas chosen from among air, nitrogen or helium.

The actuation means may be made based on a PZT, aluminium nitride, polyvinylidene fluoride or one of its copolymers, trifluoroethylene, trifluoroethylene, zinc oxide, barium titanate, lead niobate, sillenites such as bismuth titanate.

The optical device may be a lens or a mirror.

This invention also relates to a camera that may comprise at least one optical device thus characterised.

BRIEF DESCRIPTION OF THE DRAWINGS

This invention will be better understood after reading the description of example embodiments given purely for information and in no way limitative with reference to the appended drawings in which.

Identical, similar or equivalent parts of the different figures described below have the same numeric references to facilitate comparison of different figures.

The different parts shown in the figures are not necessarily at the same scale, to make the figures easier to read.

DETAILED PRESENTATION OF PARTICULAR EMBODIMENTS

Figure 1A:
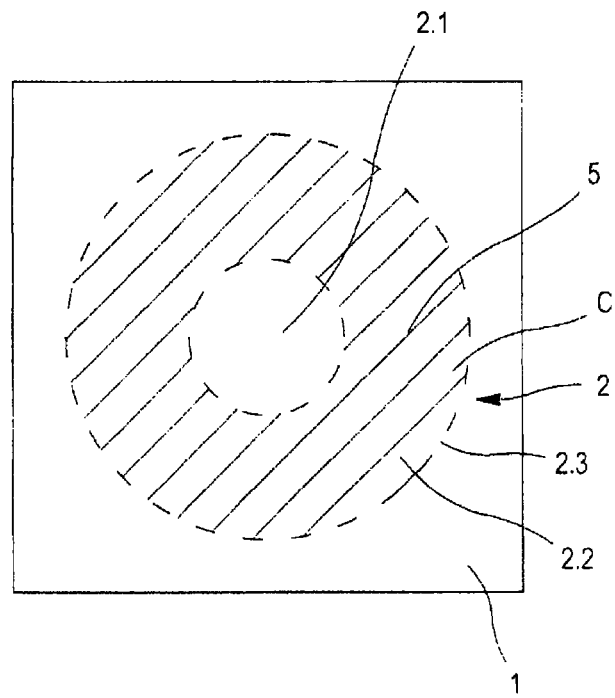
FIGS. 1A, 1B show top and sectional views of the principal actuation means of a first example of an optical device useful for understanding the invention.
Figure 1B:
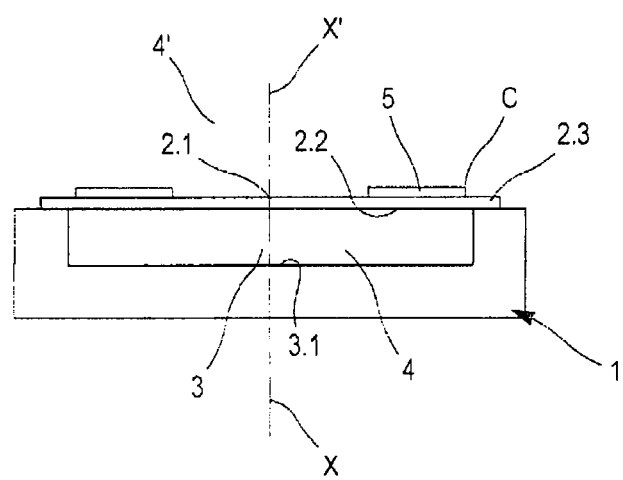

FIGS. 1A and 1B show a first embodiment of an optical device useful for understanding the invention. This optical device is made around an axis called the optical axis XX'. It comprises a membrane 2, the periphery of which is anchored in a leak tight manner on a support 1 which in this example is in the form of a dish. Therefore the membrane 2 comprises an anchor zone reference 2.3. The membrane 2 also comprises a central zone 2.1 that corresponds to an optical field of the optical device. It is materialised by dashed lines. The dish will collect a fluid 4 called the first fluid, this first fluid being a liquid or gas. More generally, the membrane 2 and the support 1 contribute to forming a cavity 3 in which the fluid 4 is trapped.

One of the faces of the membrane 2 is in contact with the fluid 4 contained in the cavity 3. The other face of the membrane 2 is in contact with a second fluid 4' that may be ambient air. A variant will be described later in which the second fluid 4' is trapped, it can be air or another gas or even a liquid.

Membrane 2 means any flexible film acting as a barrier between the first fluid 4 and the second fluid 4' on the side of the barrier opposite to the first fluid 4.

If the optical device is a lens, the cavity 3 has a bottom 3.1 that is transparent to an optical beam (not shown) that will propagate through the lens. The membrane 2 is also transparent to the optical beam at least in the central zone 2.1. If the optical device is a mirror, the membrane 2 is reflecting at least in its central zone 2.1.

The membrane 2 is capable of deforming reversibly from a rest position under the action of a displacement of the fluid 4 contained in the cavity 3 so as to vary the thickness of the fluid 4 at the central zone 2.1 of the membrane 2 and thus curve this zone of the membrane. The more flexible the membrane, the greater its deformation will be. The fluid 4 contained in the cavity 3 is sufficiently incompressible so that it can move towards the central zone 2.1 when a force is applied on the membrane 2, this force being applied on the membrane 2 in an intermediate zone 2.2 located between the central zone 2.1 and the anchor zone 2.3. The fluid 4 has an approximately constant volume within a given temperature range. The fluid 4 contained in the cavity acts as "transmission" between the actuation means and the central zone of the membrane. This fluid 4 may be a liquid or a gas.

In FIG. 1A it can be seen that the contour of the membrane 2 and the support 1 are shown as being squares, while the central zone 2.1 is shown as being circular. Obviously, these shapes are not limitative. The membrane 2 and the support 1 could be circular, rectangular, ovoid or any other shape and the central zone 2.1 could be square, rectangular, ovoid or other.

Piezoelectric actuation means are provided to displace the fluid 4 from the cavity 3. They comprise so-called principal actuation means 5 that act on the membrane 2 in the intermediate zone 2.2. These actuation means 5 are configured in at least one circular ring C mounted to be concentric around the central zone 2.1, each ring C comprising one or several piezoelectric actuators 5.1 visible in FIGS. 2A to 2D when there are several of them. These piezoelectric actuation means are anchored only on the intermediate zone 2.2 of the membrane 2. Each ring C extends in a horizontal plane when the membrane is plane. If the membrane is curved at the anchor, the piezoelectric actuators follow the curvature of the membrane. The central zone 2.1 of the membrane may have a curvature that is continuous with the curvature of the central zone during actuation. But at rest, the curvatures of these two zones may be different.

Figure 3A:
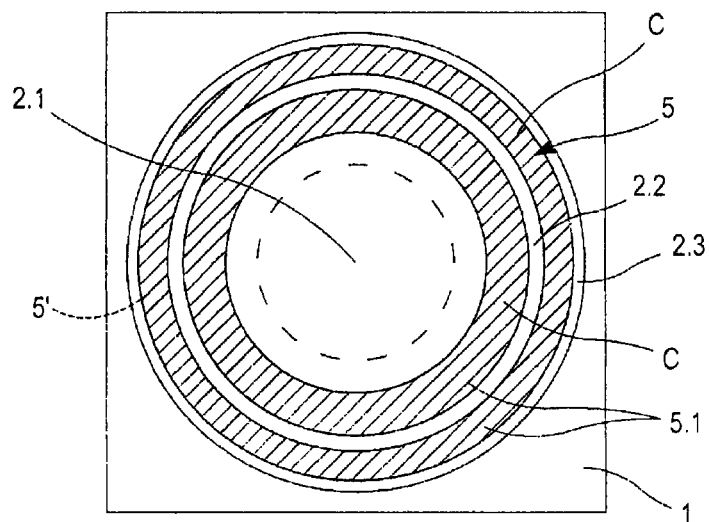
FIGS. 3A to 3D show a top view of different examples of the principal actuation means of an optical device according to the invention, these actuation means being distributed on two concentric rings, these figures also show an optical device according to the invention with the principal actuation means and supplementary actuation means, the supplementary actuation means not being anchored to the support.

When the actuation means 5 are configured in several rings C as for example can be seen in FIG. 3A, they are mounted to be concentric with each other. In this FIG. 3A, it can be considered that one of the rings can form the principal actuation means 5 and the other ring C may form supplementary actuation means 5' that will be discussed later. This is why the reference 5' is marked in dashed lines.

The principal actuation means and more particularly their piezoelectric actuators 5.1 belonging to the same ring C deform radially when they are actuated. They contract or extend in the radial direction depending on the polarisation applied to them, this deformation having the effect of changing the curvature of the membrane. In other words, the difference between the outside radius and the inside radius of the ring C varies at least locally when a piezoelectric actuator 5.1 is actuated.

It will be remembered that a piezoelectric actuator comprises a block of piezoelectric material sandwiched entirely or partially between two electrodes that when they are powered will apply an electric field to the piezoelectric material. This electric field is used to control a mechanical deformation of the block of piezoelectric material. The block of piezoelectric material may be a single layer or multi-layer and it may extend beyond an electrode. The electrodes on each side of a block of piezoelectric material can be seen in FIGS. 6A, 6B. We have thus described the inverse piezoelectric effect.

According to the invention, the principal actuation means 5 are anchored only to the intermediate zone 2.2 of the membrane 2. Therefore they do not have any anchor to the support 1. Nor are they anchored to the central zone 2.1.

The supplementary actuation means 5' are anchored in the intermediate zone 2.2 of the membrane but they may be anchored to the support 1 or not anchored to the support 1.

These principal piezoelectric actuation means 5 and the membrane 2 on which they are anchored form at least one piezoelectric bimorph that may either be heterogeneous or homogeneous. Remember that a piezoelectric bimorph comprises a layer of piezoelectric material fitted with electrodes attached to a layer that is a piezoelectric material when the bimorph is homogeneous, or a non-piezoelectric material when the bimorph is heterogeneous. In our case, this piezoelectric or non-piezoelectric material layer is a layer of the membrane 2.

Figure 2A:
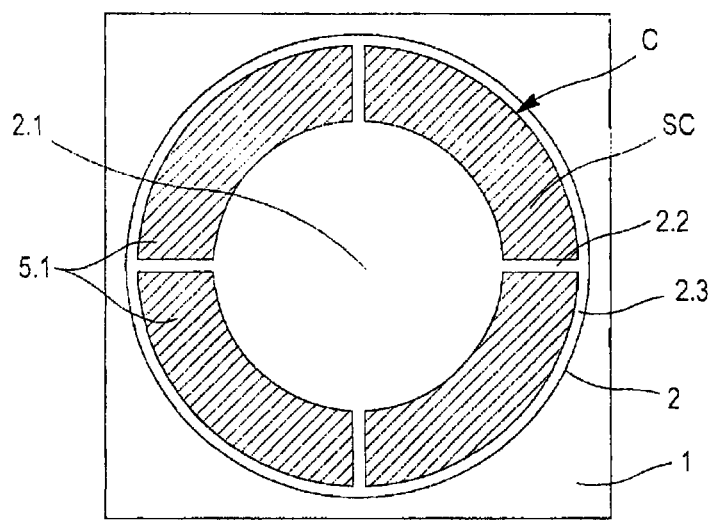
FIGS. 2A to 2E show top views of different examples of the principal actuation means of an optical device according to the invention, these actuation means being distributed on a single ring.
Figure 2B:
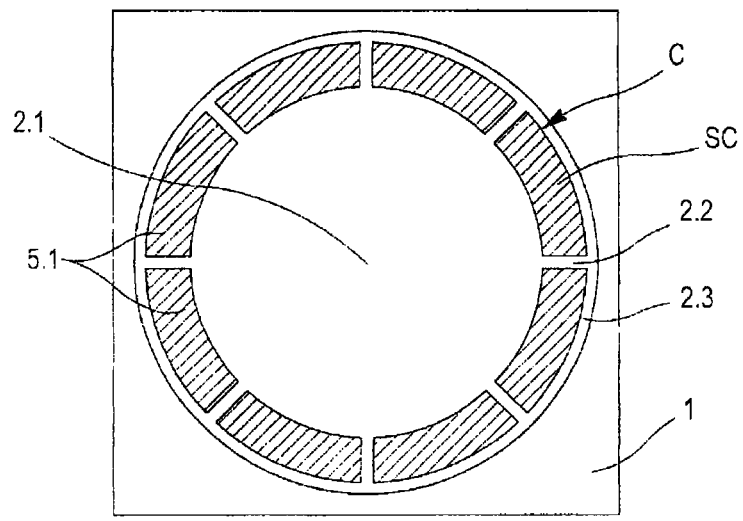
Figure 2C:
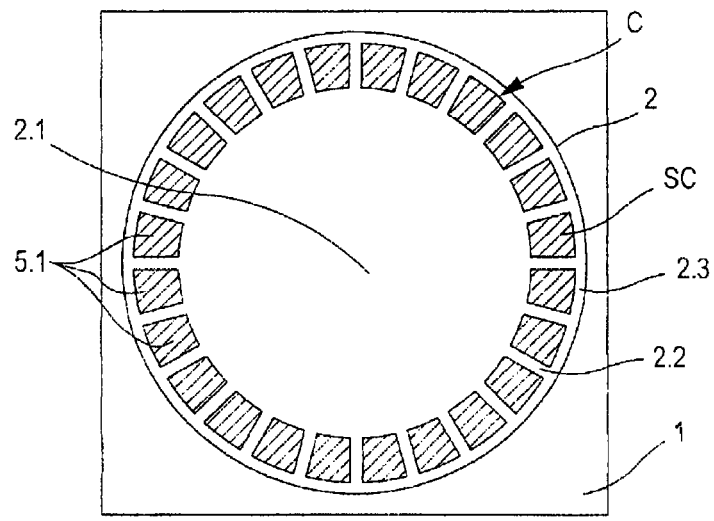
Figure 2D:
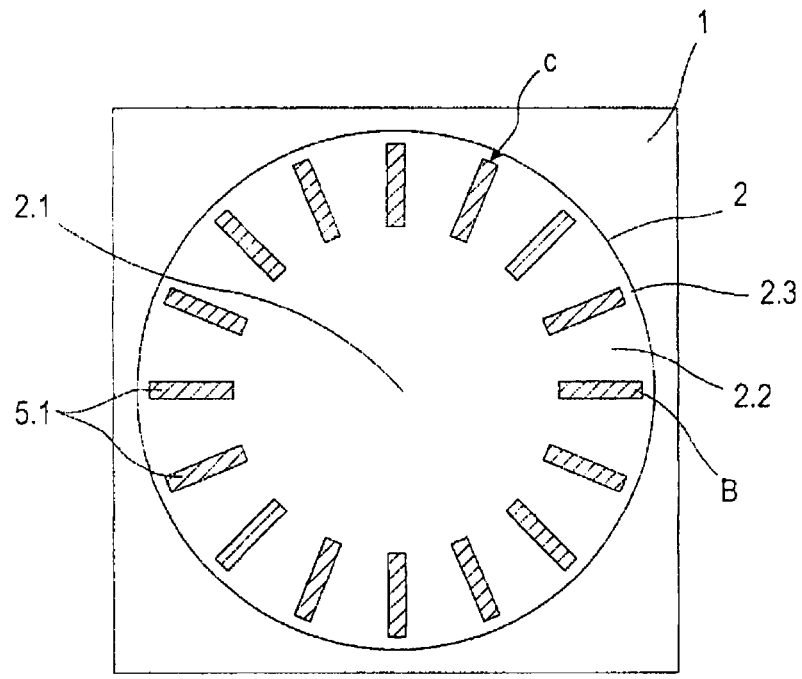

In FIGS. 1A, 1B, the principal actuation means 5 are shown comprising a single piezoelectric actuator 5.1 in the form of a continuous ring C. Of course, it is possible that the principal actuation means 5 could comprise several elementary piezoelectric actuators 5.1 arranged in a ring, the ring C then possibly being discontinuous at the piezoelectric material, or it could be continuous. Each of the elementary piezoelectric actuators 5.1 may be in the form of a ring sector SC as shown in FIGS. 2A, 2B, 2C. In FIG. 2A, there are four elementary piezoelectric actuators 5.1, the ring being broken down into four sectors SC, there are eight sectors SC in FIG. 2B, and in FIG. 2C there are twenty-four. Instead of the elementary piezoelectric actuators 5.1 being in the form of adjacent ring sectors, it is possible that they could be in the form of rods B arranged in the radial direction in a ring as shown in FIG. 2D. An attempt will be made to ensure that the space occupied by the elementary piezoelectric actuators 5.1 located on the same ring C is as large as possible in the intermediate zone so that the efficiency of the actuation is as high as possible. In attempting to make the space occupied by the rods B as large as possible and therefore that the space between two adjacent rods B is as small as possible, there could be about a hundred or even many more rods B in the ring C.

Figure 2E:
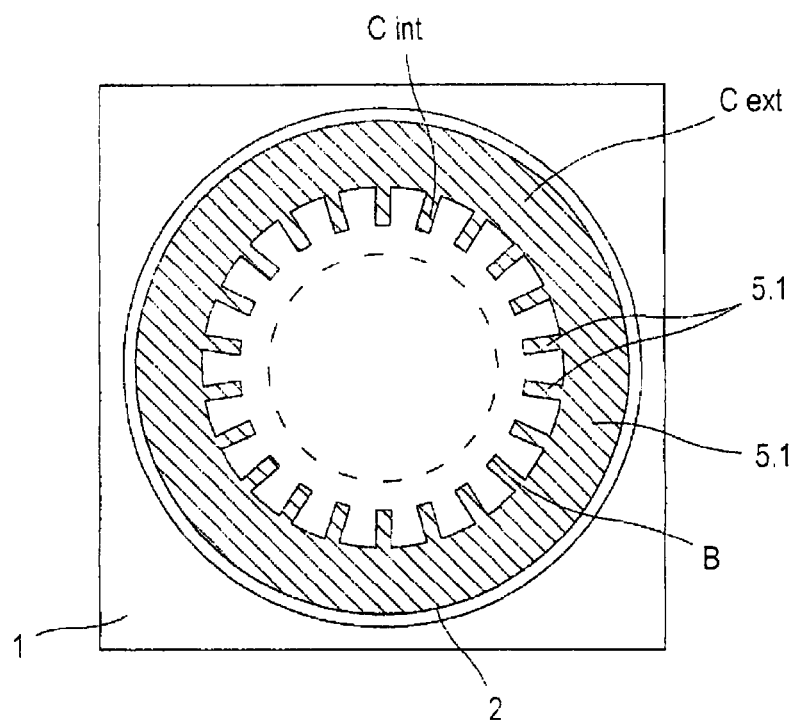

FIG. 2E shows the principal actuation means 5 arranged in two rings fixed to each other. One of the rings, in the example the outer ring Cext, comprises a single piezoelectric actuator which is continuous. The other ring in the example, the inner ring Cint contains a plurality of elementary piezoelectric actuators arranged in rods in the radial direction. Each rod is connected to the outer ring Cext. It could be envisaged that the continuous ring is broken down into pieces and contains several elementary piezoelectric actuators. It would also be possible for the outer ring to contain the plurality of rods instead of the inner ring. Such configurations have the advantage that they increase the efficiency of the optical device. This guarantees a significant variation of the focal distance due to the continuous piezoelectric surface while inclining the optical axis of the device, for example to achieve an image stabilisation function due to the ring being broken down into pieces.

It has already been mentioned that the principal actuation means 5 could be distributed in several rings C concentric around the central zone 2.1. This variant is shown in FIG. 3A. In this configuration, there is only one piezoelectric actuator 5.1 per ring C. In accordance with the invention, the two rings C are fixed to the membrane 2 and are not anchored to the support 1. They do not occupy any of the anchor zone 2.3 nor the central zone 2.1. It can be seen that this FIG. 3A can also represent principal actuation means diagrammatically shown by one of the rings C and supplementary actuation means diagrammatically shown by the other ring C. In this configuration, the supplementary actuation means are anchored to the membrane 2 only in the intermediate zone 2.2.

Figure 3B:
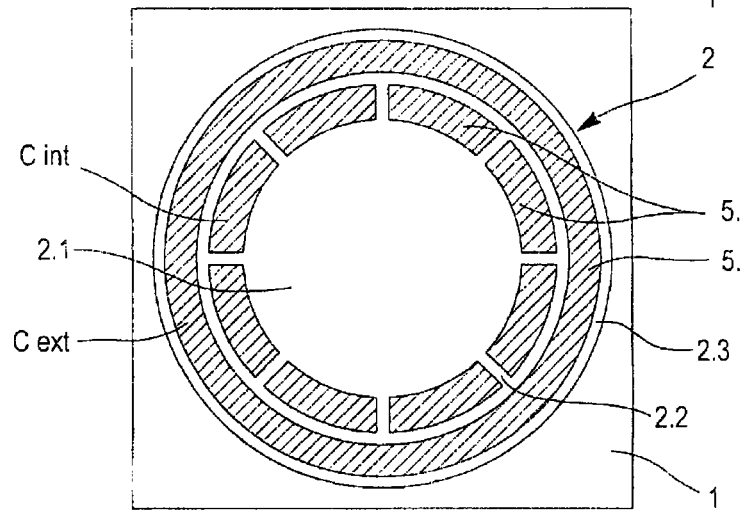
Figure 3C:
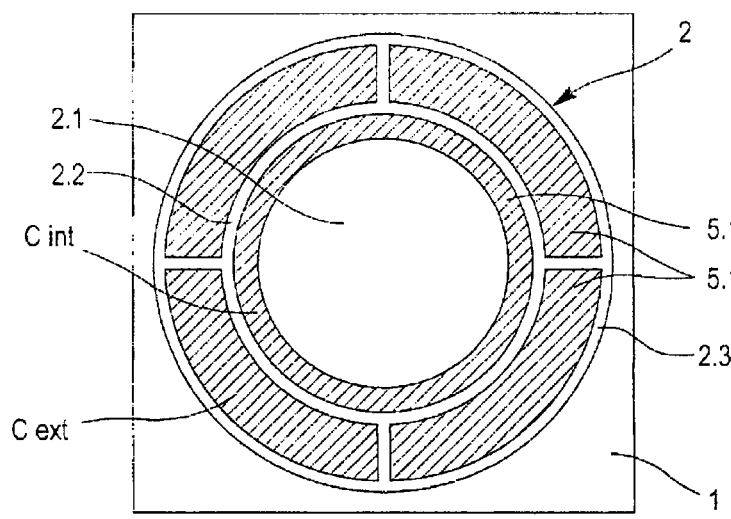
Figure 3D:
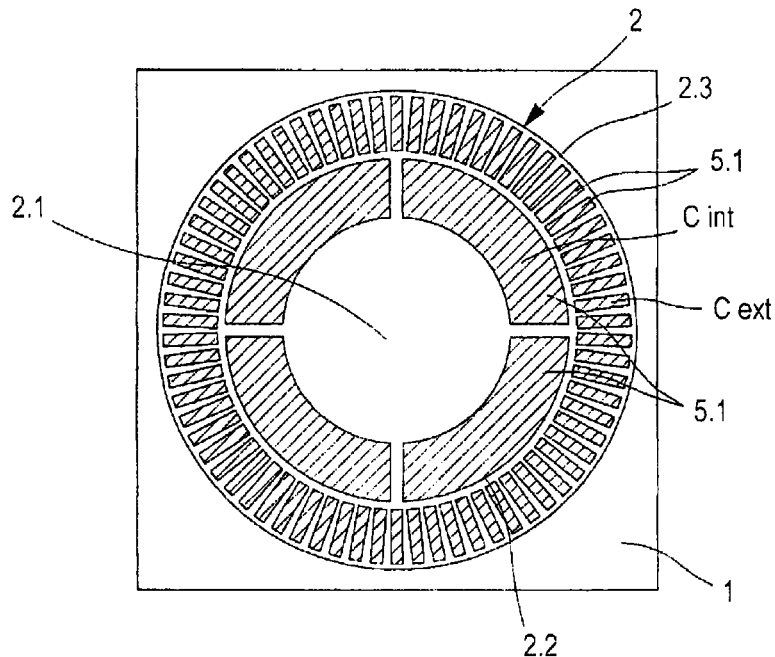

In a manner similar to what is described in FIGS. 2A to 2D, it is possible that there are several elementary piezoelectric actuators 5.1 on one ring C, and that there is a single actuator on another ring C or other rings, as shown in FIGS. 3B and 3C. In FIG. 3B, the outer ring Cext corresponds to a single piezoelectric actuator 5.1 that is continuous, and the inner ring Cint contains several elementary piezoelectric actuators 5.1, there are several blocks of piezoelectric material, the ring being discontinuous. The reverse situation is shown in FIG. 3C, the outer ring Cext contains several elementary piezoelectric actuators 5.1, there are several blocks of piezoelectric material and the inner ring Cint corresponds to a single piezoelectric actuator 5.1 and is continuous. The discontinuous rings contain elementary piezoelectric actuators 5.1 in the form of a ring sector. In FIG. 3D, the two rings Cint, Cext contain several elementary piezoelectric actuators 5.1, they are discontinuous, the elementary piezoelectric actuators 5.1 in one of the rings referenced Cint, are in the form of a ring sector and the elementary piezoelectric actuators 5.1 in the other ring Cext are in the form of rods oriented in the radial direction. In all cases, the piezoelectric actuator or the elementary piezoelectric actuators 5.1 of one ring Cint, Cext, are anchored to the membrane 2 and do not have any anchor with the support 1. This means that the rings extend over the intermediate zone 2.2 but stop before the anchor zone 2.3 of the membrane 2, they do not occupy part of it nor the central zone 2.1.

With the principal actuation means 5 comprising several elementary piezoelectric actuators 5.1, it is possible to obtain a deformed shape of the membrane 2 in the central zone 2.1 that can be axisymmetric or non-axisymmetric, however if the principal actuation means 5 comprise a single piezoelectric actuator 5.1 per ring, the deformed shape of the membrane 2 must be axisymmetric. Axisymmetric or non-axisymmetric means symmetric or non-symmetric about the optical axis XX' of the optical device.

When there are several elementary piezoelectric actuators 5.1 on a single ring, they can be activated separately from each other or all together simultaneously or they can be grouped into several groups of adjacent or non-adjacent piezoelectric actuators and all piezoelectric actuators in a group can be actuated simultaneously, each group being actuated independently of another group.

The fact of obtaining a deformed shape of the membrane 2 in the central non-axisymmetric zone 2.1 can give an advantageous dioptre to achieve an image stabilisation function.

If the principal actuation means 5 comprise a mix of several elementary piezoelectric actuators arranged in a discontinuous ring and a piezoelectric actuator arranged in a continuous ring, the actuation surface is increased while maintaining the possibility of a non axisymmetric deformation. During actuation, the energy to deform the membrane 2 is also higher than it is in the case in which there is only one ring. Such a configuration is advantageous to combine focal distance variation and image stabilisation functions. This is also true when the principal actuation means correspond to one of the rings and the supplementary actuation means correspond to the other ring.

Figure 4A:
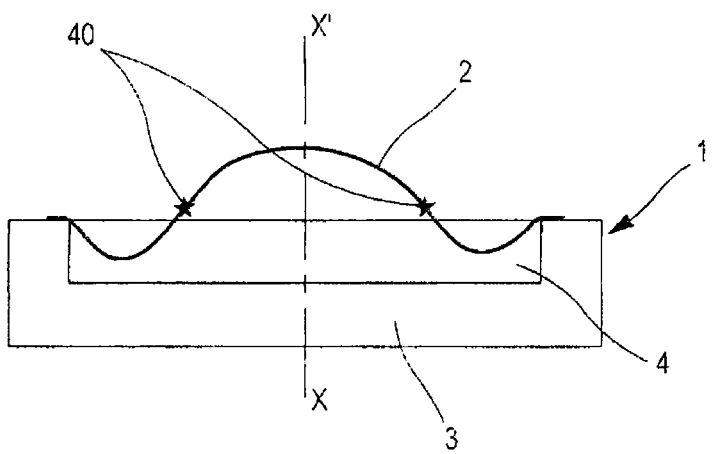
FIGS. 4A, 4B show a sectional view of the deformed membrane with two inflection points and four inflection points respectively.
Figure 4B:
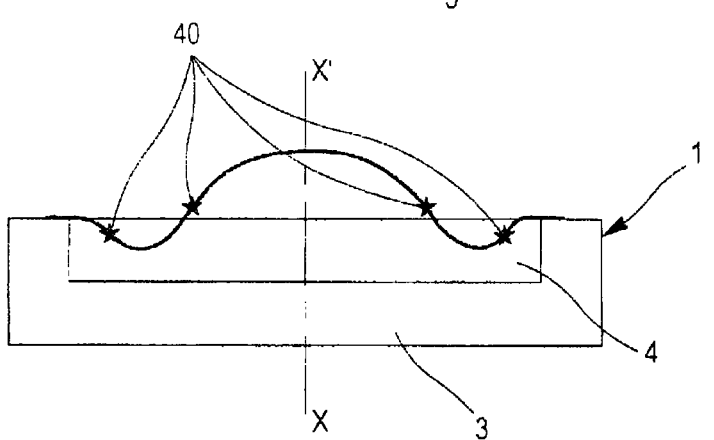

FIGS. 4A, 4B show a sectional view of the deformed shape of the membrane 2 after actuation of the principal actuation means in two different modes. Note that FIGS. 4A and 4B do not show the actuation means.

The deformed shape in FIG. 4A and FIG. 4B has two and four inflection points 40 respectively, the inflection points 40 being shown by stars. The deformed shape of the membrane 2 shown in FIG. 4A may be obtained with the actuation means shown in FIG. 1A or in FIG. 3A.

Figure 5A:
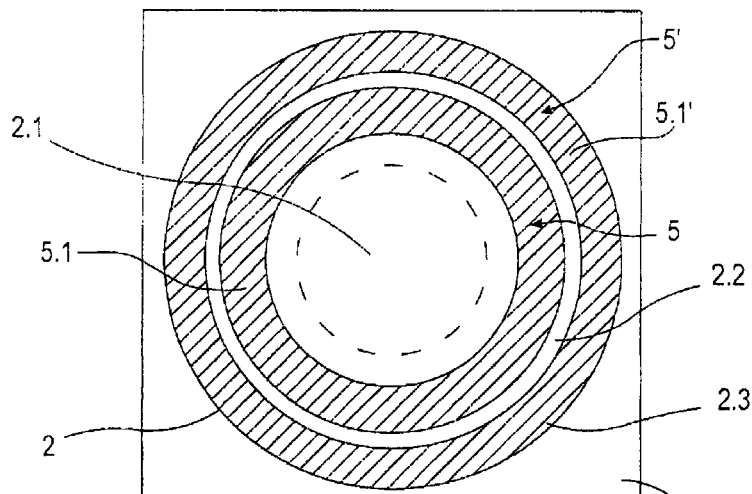
FIGS. 5A to 5D show a top view of different examples of optical devices according to the invention in which the actuation means comprise principal and supplementary actuation means, the supplementary actuation means being anchored to the support.

Four inflection points 40 can be obtained using principal actuation means 5 like described above and supplementary actuation means 5' as shown in FIG. 5A.

The principal actuation means 5 are similar to those shown in FIG. 1A, in other words they are in the form of a piezoelectric actuator 5.1 arranged in a continuous ring. The supplementary actuation means 5' are also formed from a piezoelectric actuator 5.1' arranged in a continuous ring but now the ring is anchored firstly to the membrane 2 and secondly to the support 1, it extends over the intermediate zone 2.2 and occupies part of the anchor zone 2.3 of the membrane 2. The supplementary actuation means 5' may have several elementary piezoelectric actuators 5.1' arranged in a discontinuous ring as shown in FIG. 5C. The elementary piezoelectric actuator(s) 5.1' of the supplementary actuation means also form a piezoelectric bimorph each with the membrane 2. The supplementary piezoelectric actuation means 5', and the principal actuation means 5, contract or expand in the radial direction when actuated so as to generate a displacement of said fluid from the intermediate zone to the central zone of the membrane or vice versa in order to deform the central zone relative to its rest position.

The principal actuation means and the supplementary actuation means may be controlled independently. The fact that the principal actuation means and supplementary actuation means are provided gives a means of making a fine adjustment to the deformation of the membrane in the central zone. For example, actuation of the principal actuation means makes it possible to perform an autofocus function that leads to an axisymmetric deformation of the central zone of the membrane. Actuation of the supplementary actuation means can perform an image stabilisation function, which leads to a non-axisymmetric deformation of the membrane. The two actuations may take place independently and successively.

Of course, the inverse could be envisaged, the principal actuation means can perform the image stabilisation function, and the supplementary actuation means can perform an autofocus function. Similarly, an optical zoom application can be provided for example if actuation of the principal actuation means perform an autofocus function which leads to a limited amplitude deformed shape, the actuation of the supplementary actuation means perform a zoom function when the two actuation means are actuated simultaneously.

Figure 5B:
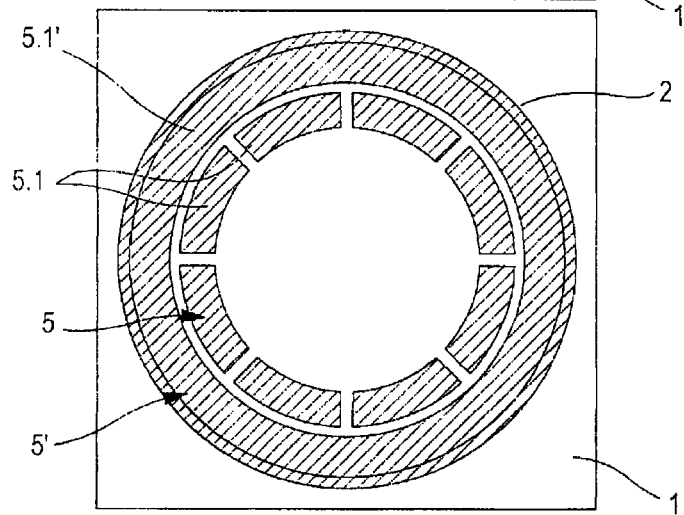
Figure 5C:
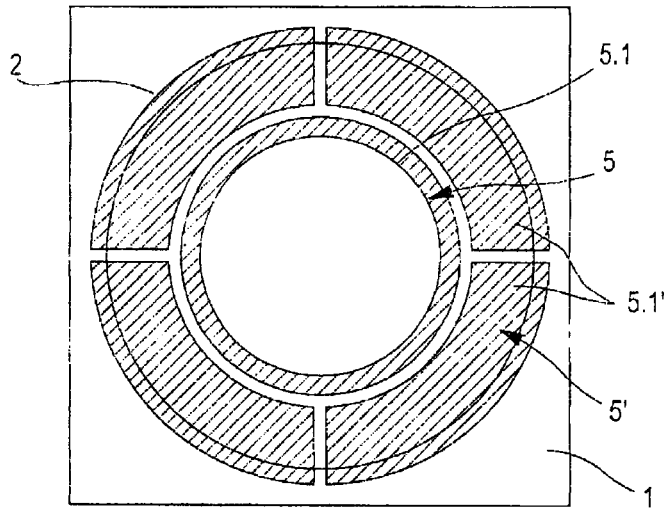
Figure 5D:
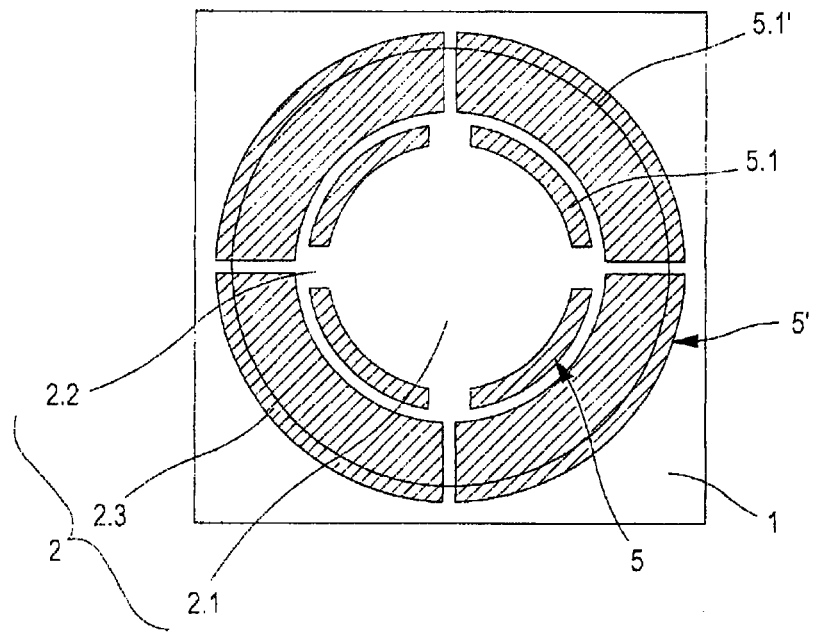

As a variant, the principal actuation means 5 may include several elementary piezoelectric actuators 5.1 arranged in a discontinuous ring while the supplementary actuation means 5' comprise a piezoelectric actuator 5.1' arranged in a continuous ring as shown in FIG. 5B. Of course, the principal actuation means 5 comprising several elementary piezoelectric actuators 5.1 arranged in a discontinuous ring could also be associated with supplementary actuation means 5' comprising several elementary piezoelectric actuators 5.1' arranged in a discontinuous ring as shown in FIG. 5D.

The principal or supplementary actuation means are positioned to be offset from the required inflection points. When there are four inflection points as shown in FIG. 4B, a ring is advantageously placed between two adjacent inflection points.

Figure 6A:
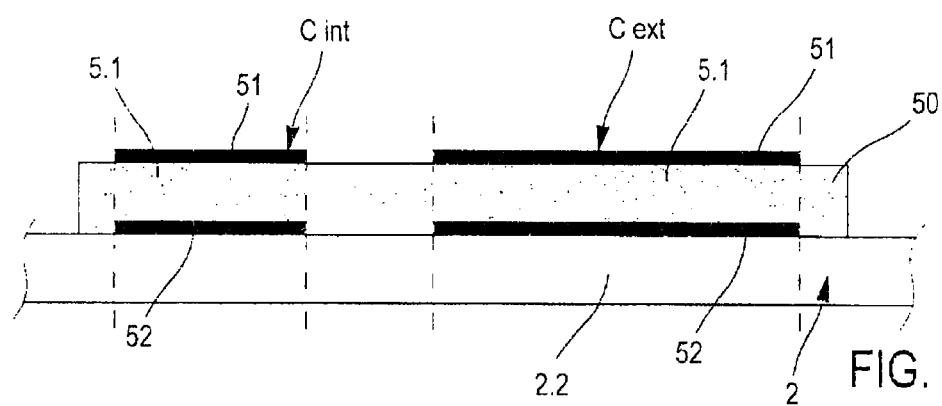
FIGS. 6A to 6D show piezoelectric actuators in optical devices according to the invention sharing a same block of piezoelectric material, regardless of whether these actuators are placed on the same ring or on distinct rings.
Figure 6B:
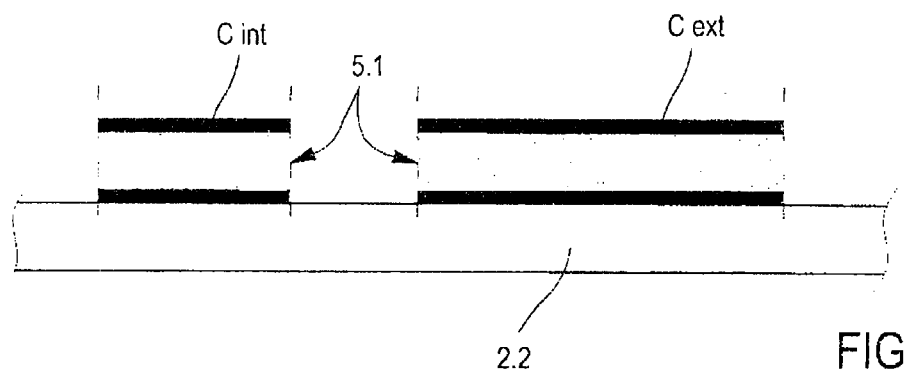
Figure 6C:
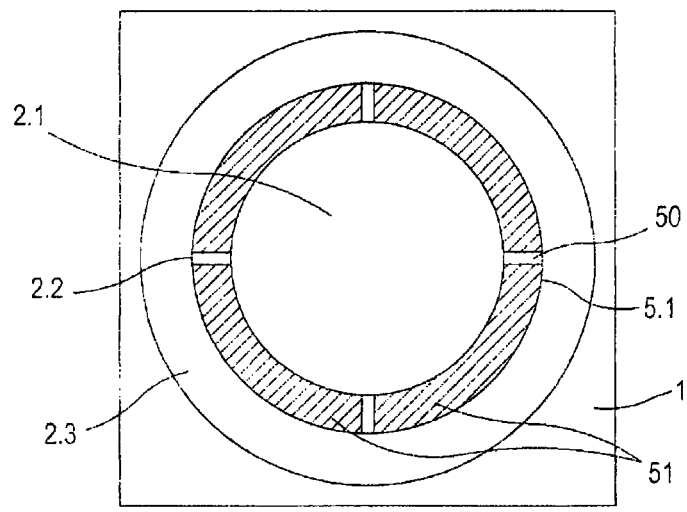
Figure 6D:
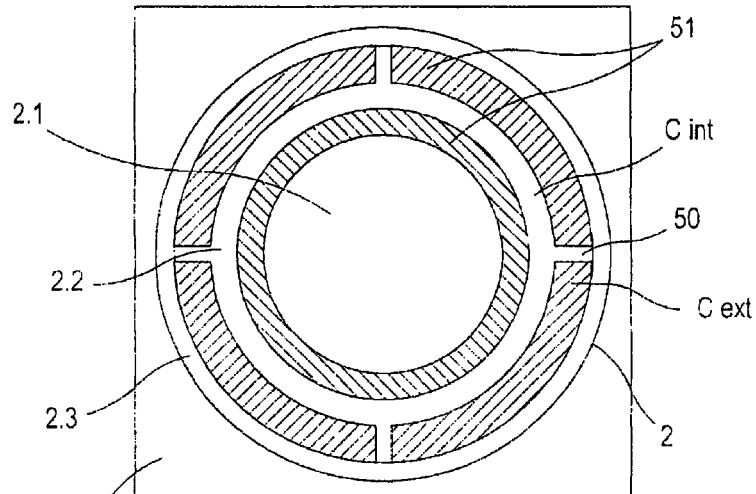

FIGS. 6A, 6B show a section through the actuation means 5 comprising piezoelectric actuators 5.1 distributed on two rings Cint, Cext, these piezoelectric actuators 5.1 share the same block of piezoelectric material 50. Two sets of electrodes 51, 52 are drawn and each set creates an electric field in the piezoelectric material 50 and generates a mechanical deformation. The two sets of electrodes (51, 52) are arranged in a ring and are placed concentrically. Such actuation means 5 are equivalent to two series of piezoelectric actuators 5.1 positioned concentrically, each of the series comprising one or several piezoelectric actuators as shown in FIG. 6B. Thus, the block of piezoelectric material 50 only deforms locally at a set of polarised electrodes. As shown in FIG. 6C, it could have been envisaged that the actuation means 5 comprise several elementary piezoelectric actuators 5.1 arranged in a ring and that these piezoelectric actuators share the same block of piezoelectric material 50 in the form of a continuous ring. Four sets of discontiguous electrodes arranged in a ring sector are placed on this block of piezoelectric material 50. FIG. 6C is a top view and shows only a single electrode 51 in each set. FIG. 6D shows a top view of a configuration of the actuation means 5 comprising a piezoelectric actuator configured as an inner ring Cint and several elementary piezoelectric actuators configured in a single outer ring Cext, the actuators all sharing the same block of piezoelectric material 50. The electrodes of the piezoelectric actuator of the outer ring are in a ring while the electrodes of the elementary piezoelectric actuators of the outer ring are in the form of a ring sector. Once again, in FIG. 6, one of the rings Cint or Cext could act as the principal actuation means and the other ring Cext or Cint could act as the supplementary actuation means.

The coupling mode between the piezoelectric material and the electrodes is shown transversely because it is easy to implement. The piezoelectric material layer is sandwiched at least locally between one or several pairs of electrodes. But of course, any other coupling mode, for example longitudinal or shear, could be adopted.

Each pair of electrodes may be powered independently of the others, which means that different voltages could be applied to all pairs of electrodes. Thus, the deformation of the membrane 2 in the central zone 2.1 may be non-axisymmetric and there are many possible deformation variations.

Therefore, the inverse piezoelectric effect will be used to control deformation of the central zone 2.1 of the membrane 2.

Figure 6E:
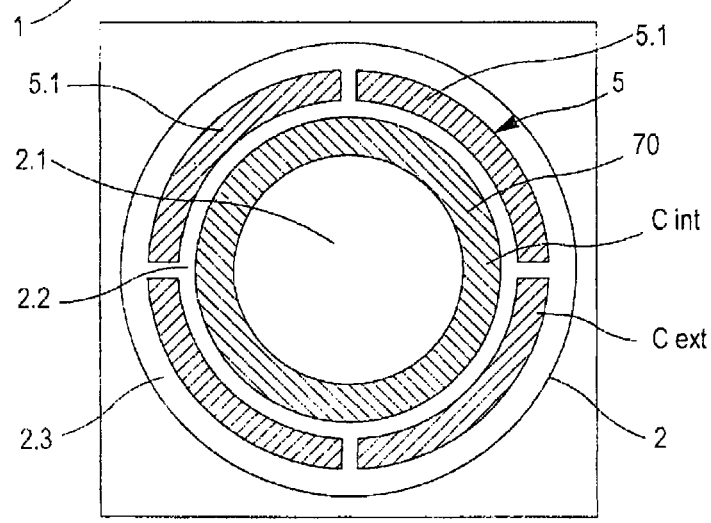
FIG. 6E shows that the optical device is provided with one or several piezoelectric actuators that can operate passively by a direct piezoelectric effect and dedicated to monitoring deformation of the membrane.

The direct piezoelectric effect can be used to monitor deformation of the membrane 2. The voltage that appears at the terminals of a non-actuated elementary piezoelectric actuator can be acquired, while other elementary piezoelectric actuators in the same ring are actuated. It would also be possible to provide one or several piezoelectric actuators capable of operating passively by a direct piezoelectric effect arranged in a ring specially dedicated to this monitoring as shown in FIG. 6E. The inner ring Cint is formed from at least one passive piezoelectric actuator 70 detecting local deformation of the membrane by direct effect. The actuation means 5 are formed from several elementary piezoelectric actuators

5.1 arranged in an outer ring. These piezoelectric actuators 5.1 can be actuated by the inverse effect. This actuator is anchored to the membrane in the intermediate zone and possibly in the anchor zone.

Of course, it would be possible that a single piezoelectric actuator will deform the membrane intermittently and will monitor the deformation of the membrane intermittently. It may thus be passive at some times and active at others.

Yet another variant would be to use a strain gauge of another type instead of a piezoelectric actuator to monitor deformation of the membrane.

Figure 7A:
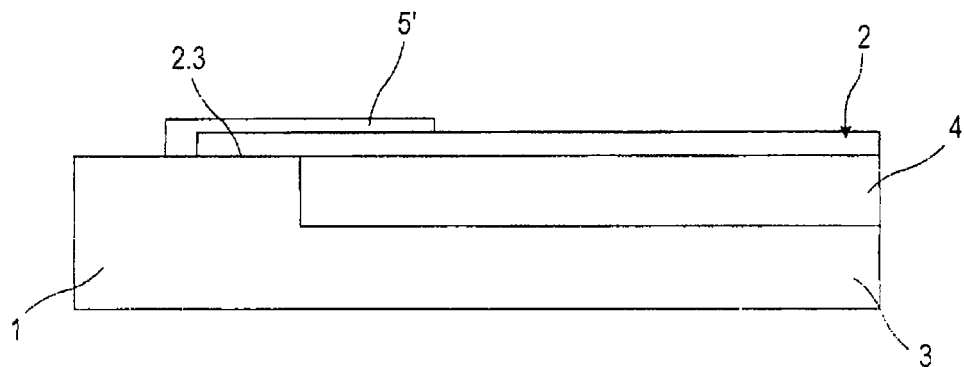
FIGS. 7A to 7C show sectional views of different configurations of the anchor to the support of the supplementary actuation means.
Figure 7B:
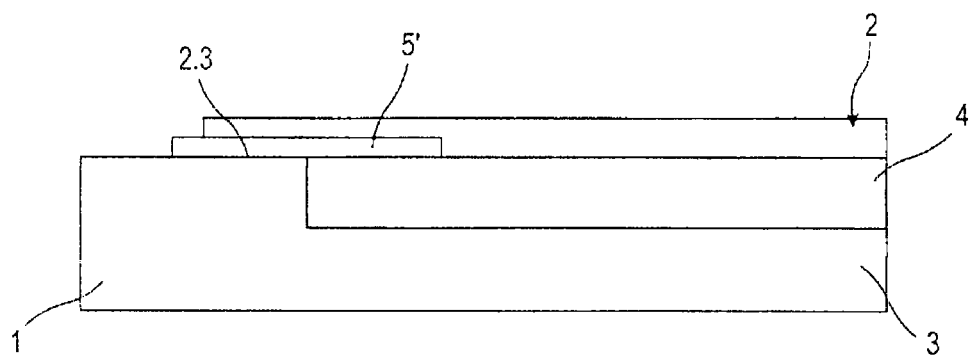
Figure 7C:
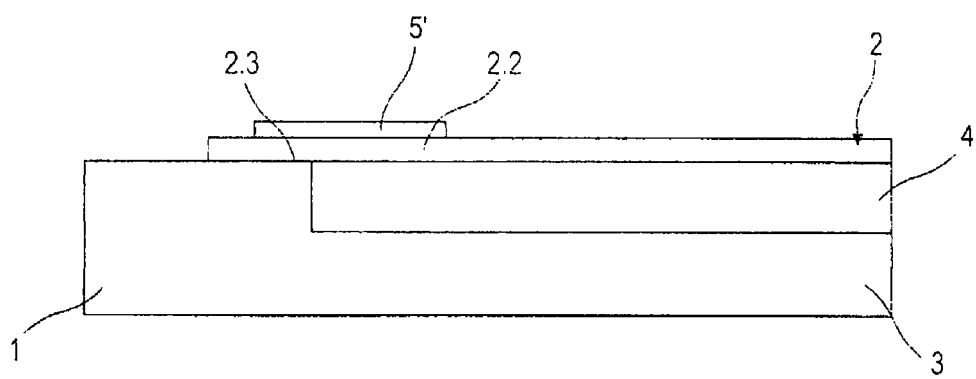

When the optical device is provided with supplementary actuation means 5' anchored to the support 1, the anchor may be direct as shown in FIGS. 7A and 7B or indirect as shown in FIG. 7C. In FIG. 7A, the supplementary actuation means 5' are superjacent to the membrane 2, they extend onto the intermediate zone 2.2 and the anchor zone 2.3 and extend directly on the support 1. They do not have any contact with the fluid 4 trapped between the membrane 2 and the support 1. In FIG. 7B, they are subjacent to the membrane 2 and in the same way extend over the intermediate zone 2.2 and the anchor zone 2.3 and they prolong directly onto the support 1.

In FIG. 7C, the supplementary actuation means 5' are superjacent to the membrane 2, they extend over the intermediate zone 2.2 and the anchor zone 2.3, possibly partially, but they do not occupy the support 1 directly. The principal actuation means are not shown in these FIGS. 7A, 7B, 7C for reasons of clarity.

Figure 8A:
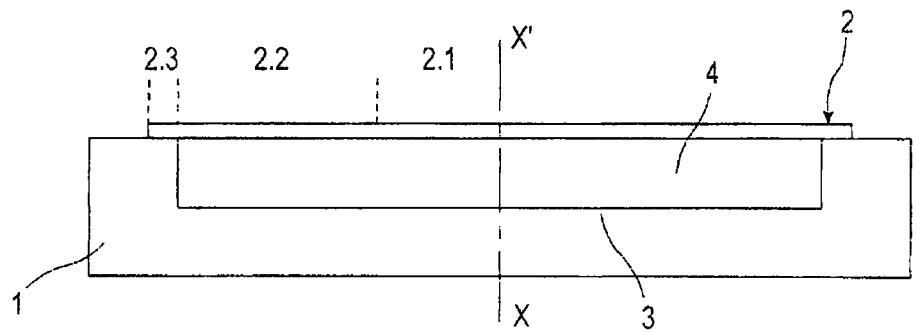
FIGS. 8A, 8B, 8C show different configurations for the membrane of an optical device according to the invention, the actuation means being omitted.
Figure 8B:
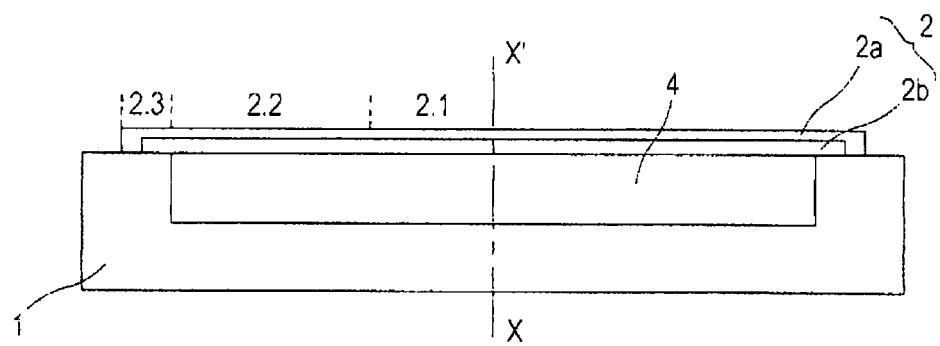
Figure 8C:
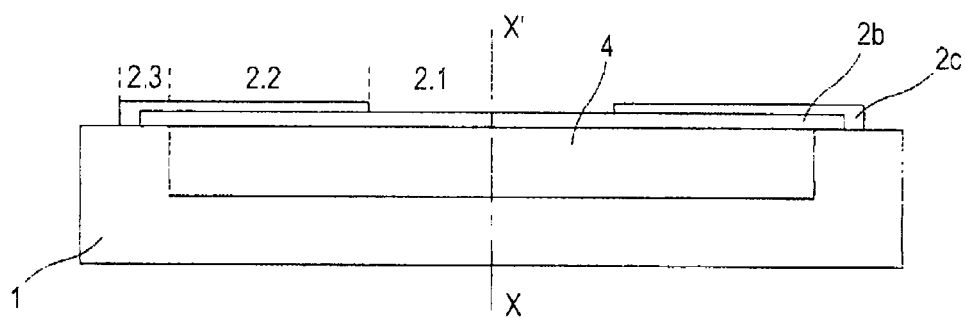

We will now describe a few characteristics of the membrane 2 with reference to FIGS. 8A to 8C. This membrane 2 comprises at least three zones as we have already described called anchor zone 2.3, intermediate zone 2.2 and central zone 2.1, in the direction from its edge towards its centre. The intermediate zone 2.2 is the zone to which the actuation means not shown are directly applied. The central zone 2.1 dedicated to the optical field is deformed by movements of the fluid 4. Since this deformation is reversible, the material in this central zone 2.1 will operate in the elastic deformation range. Its transparency or on the other hand its reflecting properties have already been mentioned above. It is possible that the membrane 2 is single layer and homogeneous from the central zone 2.1 as far as the anchor zone 2.3 (FIG. 8A). As a variant, it may be multi-layer as shown in FIG. 8B, the two layers being referenced 2a, 2b. It has two superposed layers 2a, 2b in the central zone 2.1, in the intermediate zone 2.2 and in part of the anchor zone 2.3. In this anchor zone 2.3 the superjacent layer 2a of the stack is prolonged directly on the support 1 beyond the subjacent layer 2b.

The anchor zone 2.3 of the membrane 2 must have bond properties on the support 1. The superjacent layer 2a in FIG. 8B may be chosen to have better bond properties on the support 1 than the subjacent layer 2b.

The intermediate zone 2.2 of the membrane 2 may have properties that accentuate the deformation induced by the actuation means, which means that it will preferably be chosen to be stiffer than the central zone 2.1. In fact, there is interaction between the actuation means and the membrane 2 itself. The membrane 2 contributes to actuation, and it forms bimetallic strip with each piezoelectric actuator. It is thus possible that the intermediate zone 2.2 is multi-layer and there are several possibilities about the position of the actuation means relative to the different layers of the intermediate zone 2.2.

Figure 9A:
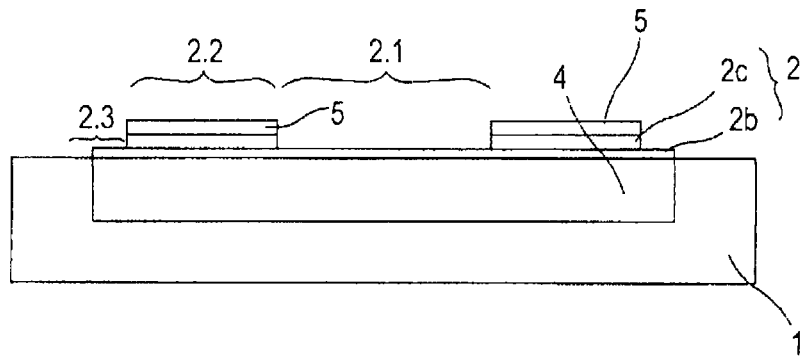
FIGS. 9A to 9H show different configurations for the actuation means and for the multi-layer membrane in an optical device according to the invention, the supplementary actuation means only being shown in FIGS. 9F to 9H.
Figure 9B:
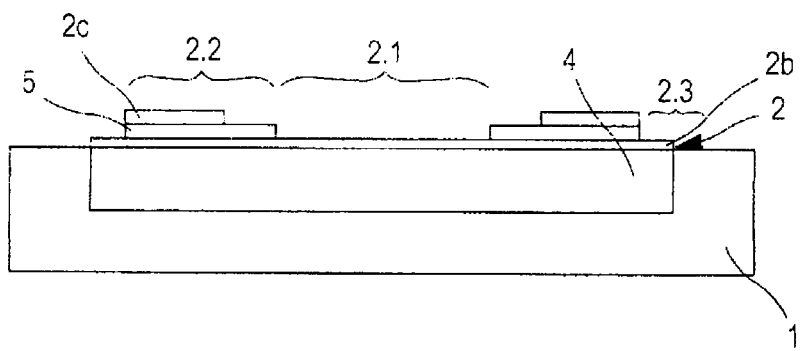
Figure 9C:
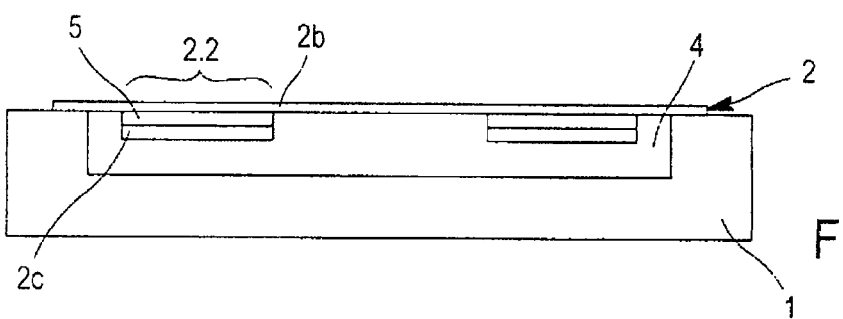

The membrane 2 may be heterogeneous with at least one principal layer 2b that occupies the central zone 2.1 and in some configurations extends over the entire surface of the membrane 2 and at least one reinforcement layer 2c that only extends over part of the membrane 2, including at least the intermediate zone 2.2. In FIG. 8C that shows this case, the principal layer 2b extends over the entire surface of the membrane 2 and the reinforcement layer 2c in this example extends on the anchor zone 2.3 and on the intermediate zone 2.2. The reinforcement layer 2c occupies part of the support 1 directly in the same way as in FIG. 9B with layer 2b. In FIGS. 9A, 9B, 9C, the membrane 2 comprises a continuous principal layer 2b that extends over its entire surface, but this is not an obligation as will be seen later.

The principal or supplementary actuation means may be subjacent to the membrane 2 and be in contact with the fluid 4 that it traps in cooperation with the support 1, or it may be superjacent to the membrane 2, or it may be integrated into the membrane 2 that is then multi-layer.

When the principal or supplementary actuation means are distributed on several rings, the piezoelectric actuators arranged on the different rings are not necessarily all positioned in the same location relative to the membrane 2. We will consider the various possible positions for the actuation means 5, 5' relative to the membrane 2, with reference to FIGS. 9A to 9H. There are other possibilities. FIGS. 9A to 9E show actuation means being the principal actuation means 5 comprising one or several piezoelectric actuators arranged in a single ring, and consequently they are not anchored to the support 1. They are only anchored to the intermediate zone 2.2 of the membrane 2.

In FIG. 9A, the membrane 2 comprises a continuous layer 2b that extends from the central zone 2.1 as far as the anchor zone 2.3, a superjacent reinforcement layer 2c that only extends in the intermediate zone 2.2. The actuation means 5 are arranged in a single ring, and are superjacent to the reinforcement layer 2c. They are without contact with the fluid 4 that the membrane 2 and the support 1 contribute to trapping.

FIG. 9B shows the continuous layer 2b that extends from the central zone 2.1 to the anchor zone 2.3 and the actuation means 5 placed at the intermediate zone 2.2 of the membrane 2 are sandwiched between the continuous layer 2b and the reinforcement layer 2c. The reinforcement layer 2c and the actuation means 5 are without contact with the fluid 4 that the membrane 2 and support 1 contribute to trapping. The reinforcement layer 2c does not fully coincide with the actuation means 5 which extend beyond the reinforcement layer 2c. The opposite would be possible, with the reinforcement layer 2c possibly extending beyond the actuation means 5.

FIG. 9C shows the continuous layer 2b and the actuation means 5 placed at the intermediate zone 2.2 of the membrane 2 are sandwiched between the continuous layer 2b and the reinforcement layer 2c. But in this case the reinforcement layer 2c and the actuation means 5 are in contact with the fluid 4 that the membrane 2 and the support 1 contribute to trapping.

Figure 9D:
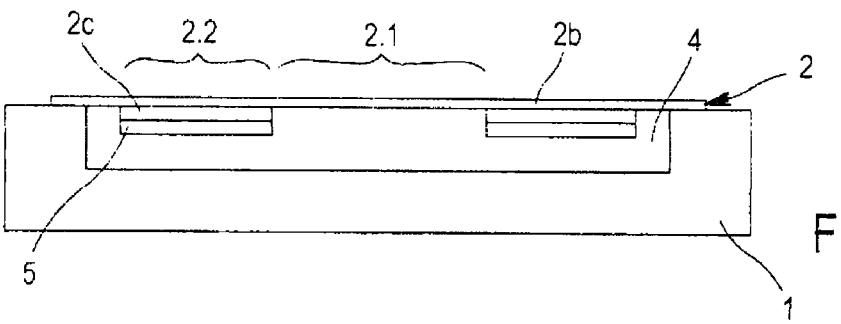

FIG. 9D shows the continuous layer 2b, and the reinforcement layer 2c placed at the intermediate zone 2.2 of the membrane 2 is sandwiched between the continuous layer 2b and the actuation means 5. But in this case the reinforcement layer 2c and the actuation means 5 are in contact with the fluid 4 that the membrane 2 and the support 1 contribute to trapping.

Figure 9E:
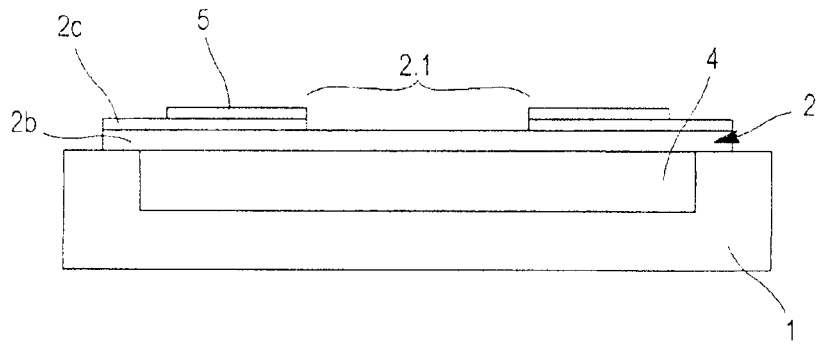

In FIGS. 9A, 9C and 9D, the reinforcement layer 2c and the actuation means 5 have coincident surfaces. Of course, this is not an obligation as can be seen in FIG. 9B. In FIG. 9E, there is a continuous layer 2b and a reinforcement layer 2c sandwiched between the continuous layer 2b and the actuation means 5. The reinforcement layer 2c extends beyond the actuation means 5, it occupies part of the anchor zone 2.3. On the other hand, it is preferable that it does not occupy part of the central zone 2.1 to avoid making it too stiff.

Figure 9F:
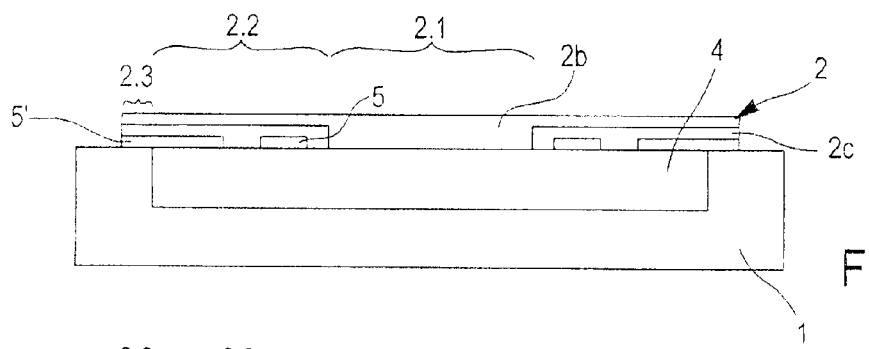
Figure 9G:
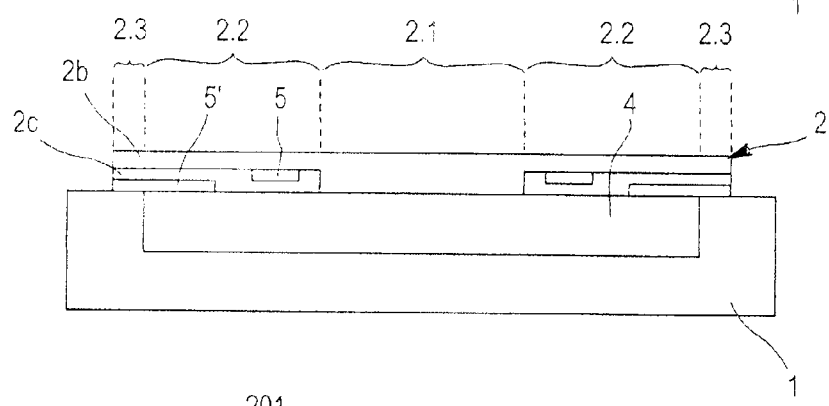
Figure 9H:
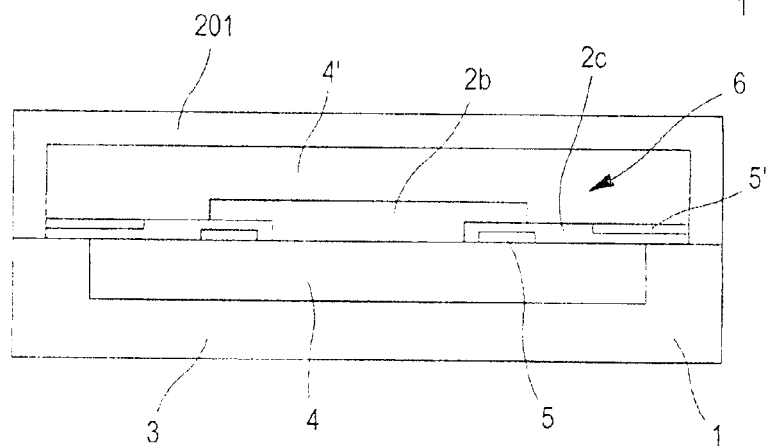

FIGS. 9F, 9G, 9H show the principal actuation means 5 comprising one or several piezoelectric actuators arranged in a ring without anchor to the support 1, and supplementary actuation means 5' comprising one or several piezoelectric actuators arranged in a ring anchored directly to the support 1.

In FIG. 9F, the principal actuation means 5 and the supplementary actuation means 5' are in contact with the fluid 4 trapped between the membrane 2 and the support 1. They are both on the same side of the reinforcement layer 2c that is superjacent to the continuous layer 2b. The reinforcement layer 2c is between the actuation means 5, 5' and the continuous layer 2b. The principal actuation means 5 and the supplementary actuation means 5' are not contiguous and a space is formed between them, the reinforcement layer 2c occupies this space and comes into contact with the fluid 4 in this space. It can be seen that the continuous layer 2b has no contact with the principal actuation means 5, since there is a space formed between them. The reinforcement layer 2c occupies this space. Thus, the continuous layer 2b has a variable thickness, it is thicker at the central zone 2.1 than at the intermediate zone 2.2 and the anchor zone 2.3.

In FIG. 9G, the supplementary actuation means 5' and the principal actuation means 5 are not located on the same side of the reinforcement layer 2c. The supplementary actuation means 5' are on the side of the fluid 4 that the membrane 2 and the support 1 contribute to trapping. The principal actuation means 5 are opposite the fluid 4 relative to the reinforcement layer 2c. The continuous layer 2b extends from the central zone 2.1 to the anchor zone 2.3 as in the example shown in FIG. 9F. Once again, the reinforcement layer 2c occupies the space between the principal actuation means 5 and the supplementary actuation means 5' and the space between the principal actuation means 5 and the continuous layer 2b.

FIG. 9H is yet another example of the membrane 2 in which the principal actuation means 5 and the supplementary actuation means 5' are not always on the same side of the reinforcement layer 2c. The principal actuation means 5 are in contact with the fluid 4 trapped between the support 1 and the membrane 2. The supplementary actuation means 5' are on the side of the reinforcement layer 2c opposite the fluid 4. They are anchored to the support 1 through the reinforcement layer 2c. Another difference from the previous configurations is that the layer 2b at the central zone 2.1 is not continuous as far as the anchor zone 2.3 as it was before. It extends to the intermediate zone 2.2 but stops before the anchor zone 2.3. Once again, this layer 2b that extends at the central zone 2.1 is thicker at the central zone 2.1 than at the intermediate zone 2.2. The assembly between the reinforcement layer 2c and the layer that occupies the central zone 2.1 must be sufficiently leak tight so that the fluid 4 that the support 1 and the membrane 2 contribute to trapping cannot escape from the cavity, even when the actuation means 5, 5' are actuated.

In FIGS. 9F to 9H, the reinforcement layer 2c is common to the principal actuation means 5 and the supplementary actuation means 5'. If one of these actuation means comprises elementary piezoelectric actuators arranged in a ring broken into several sectors or rods, it would be possible that the reinforcement layer 2c could be continuous. It will be seen later that as a variant, it may be discontinuous.

In all these examples, the layer 2b that occupies the central zone and the reinforcement layer 2c are shown as being single layer, but it is obvious that one or both of them could be multi-layer.

Figure 10A:
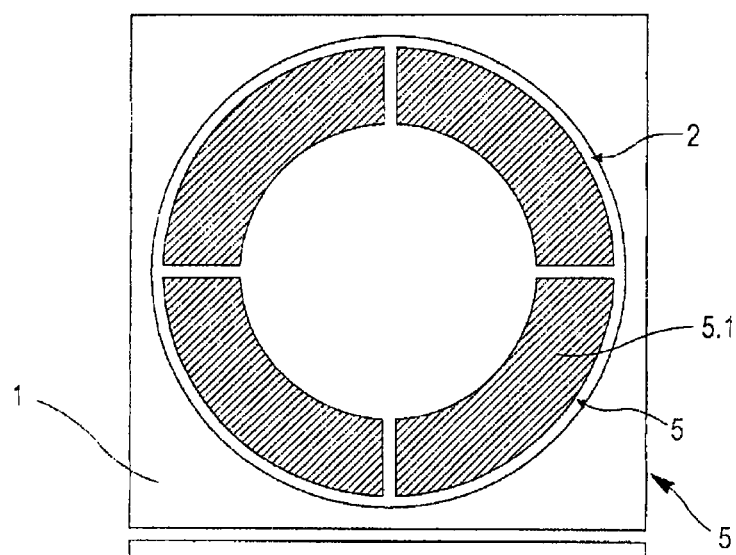
FIGS. 10A to 10F show a top view of different arrangements between the principal actuation means and a reinforcement layer, the supplementary actuation means being visible in FIGS. 10C, 10E.
Figure 10B:
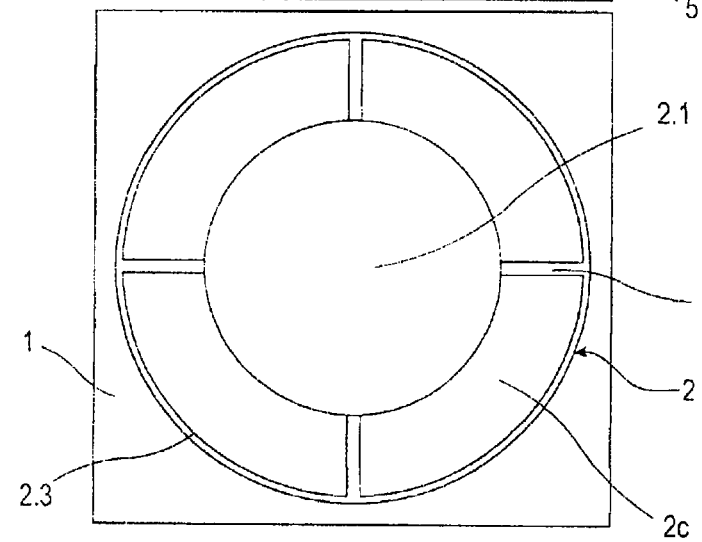
Figure 10C:
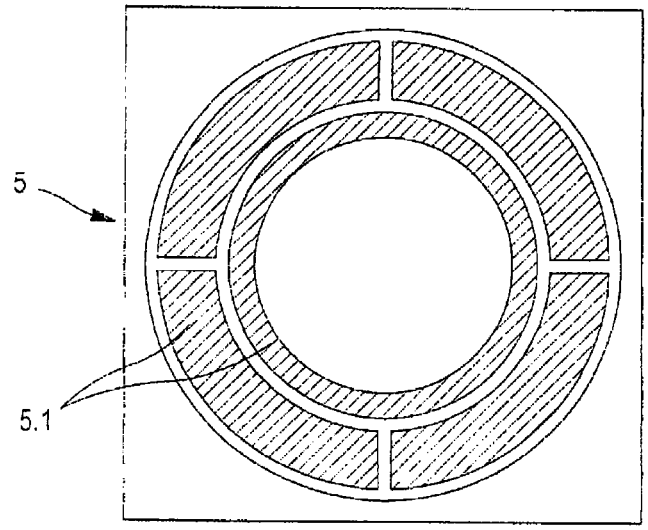
Figure 10D:
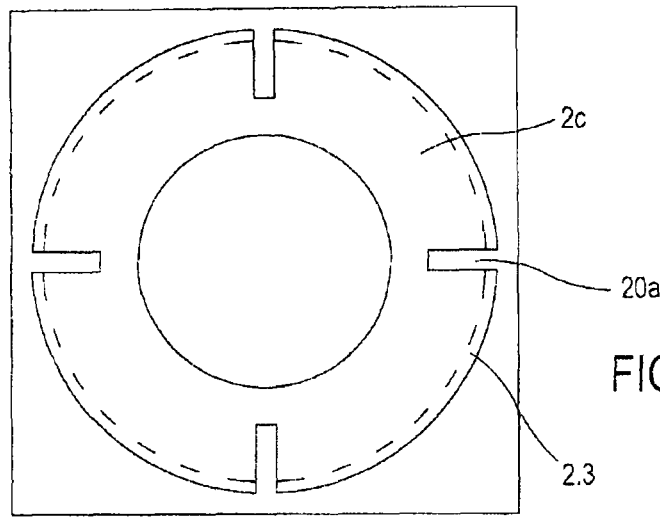
Figure 10E:
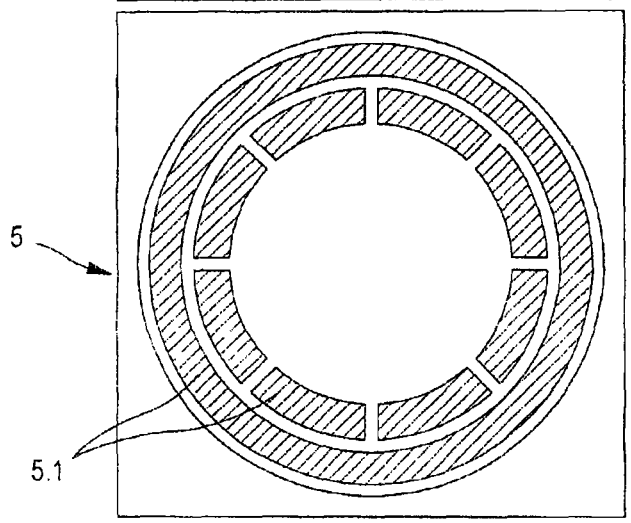
Figure 10F:
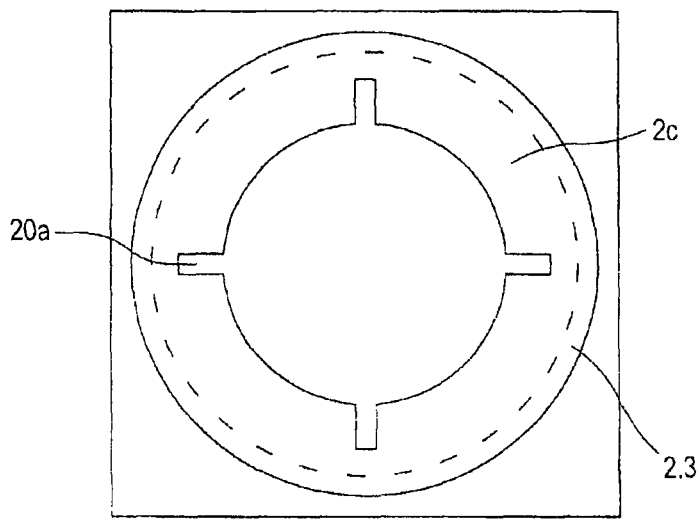

It is possible that the reinforcement layer 2c is not continuous as shown in FIG. 10B or that it is partially discontinuous as shown in FIGS. 10D, 10F. In these configurations, the contour of the reinforcement layer 2c is approximately the same as the contour of the principal actuation means 5.

FIG. 10A shows a top view of the principal actuation means 5 formed from several elementary piezoelectric actuators 5.1 in ring sectors arranged in a ring. FIG. 10B shows the reinforcement layer 2c that is also broken down into four ring sectors, but it is larger because it occupies part of the anchor zone 2.3. Its inside radius is approximately the same as the inside radius of the ring of the principal actuation means 5 while its outside radius is larger than the outside radius of the principal actuation means 5. During assembly, the principal actuation means 5 are superposed on the reinforcement layer 2c that is then sandwiched between the layer 2b that extends in the central zone 2.1 and the actuation means 5. The four sectors of the actuation means 5 are superposed on the four sectors of the reinforcement layer 2c. The sectors of the actuation means 5 do not project beyond the sectors of the reinforcement layer 2c. The supplementary actuation means are not shown in this configuration, in order to avoid cluttering the figures (FIGS. 10A, 10B).

FIG. 10C shows the principal actuation means 5 formed from piezoelectric actuators 5.1 arranged in two rings, one on the inside being continuous and the other on the outside being discontinuous and broken into four sectors. The reinforcement layer 2c shown in FIG. 10D is in the form of a ring for which the inside radius is approximately equal to the inside radius of the inner ring and the outside radius of which is larger than the outside radius of the outer ring of the actuation means. In this configuration, it is assumed that the reinforcement layer 2c occupies part of the anchor zone 2.3. The ring of the reinforcement layer 2c is provided with radial notches 20a open to the outside of the ring, which are fixed in relation to the space separating two adjacent sectors of the actuation means 5. These two FIGS. 10C and 10D may also represent principal actuation means formed from one of the rings and supplementary actuation means formed from the other ring.

FIG. 10E shows the principal actuation means 5 formed from several piezoelectric actuators 5.1 arranged in two concentric rings, one on the outside which is continuous and the other on the inside is discontinuous and is broken down into eight sectors. The reinforcement layer 2c shown in FIG. 10F is in the form of a ring for which the inside radius is approximately equal to the inside radius of the inner ring and the outside radius is approximately equal to the outside radius of the outer ring of the actuation means 5. In this configuration, it is assumed that the reinforcement layer 2c does not occupy part of the anchor zone 2.3. The ring of the reinforcement layer 2c is provided with radial notches 20a open to the inside edge of the ring, which are fixed relative to the space separating two adjacent sectors of the actuation means. These two FIGS. 10E and 10F can also show the principal actuation means formed from one of the rings and the supplementary actuation means formed from the other ring.

The different configurations shown are not limitative and others are obviously possible.

Figure 11A:
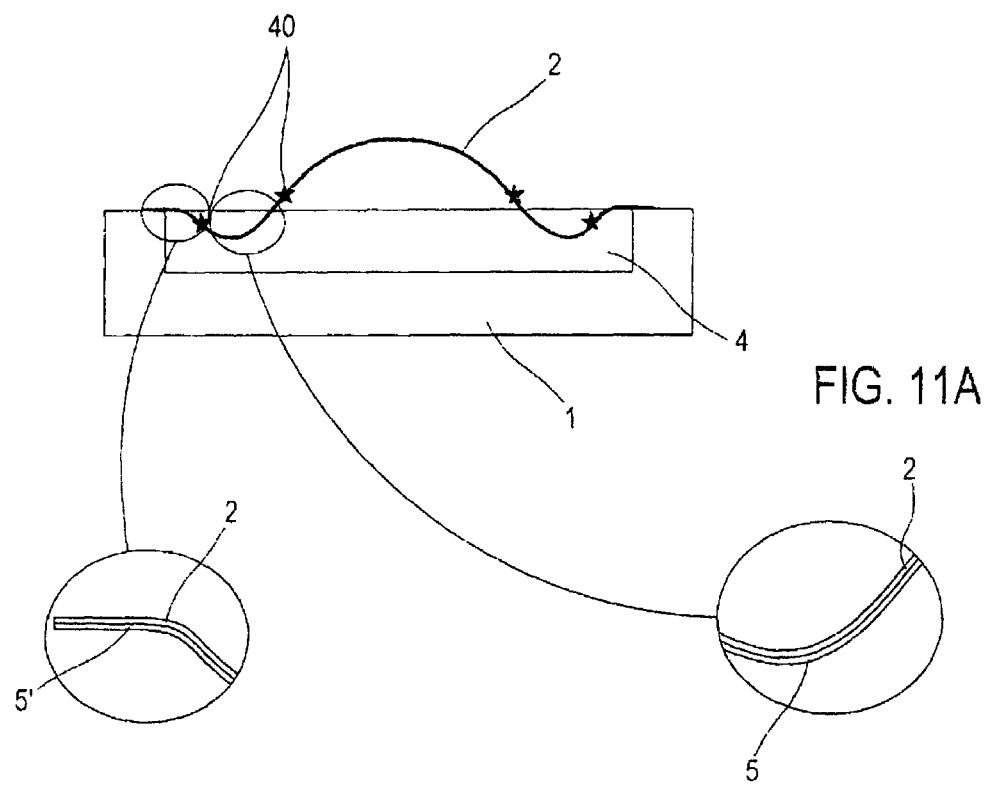
FIGS. 11A, 11B show the position of the actuation means to obtain given inflection points on the membrane.
Figure 11B:
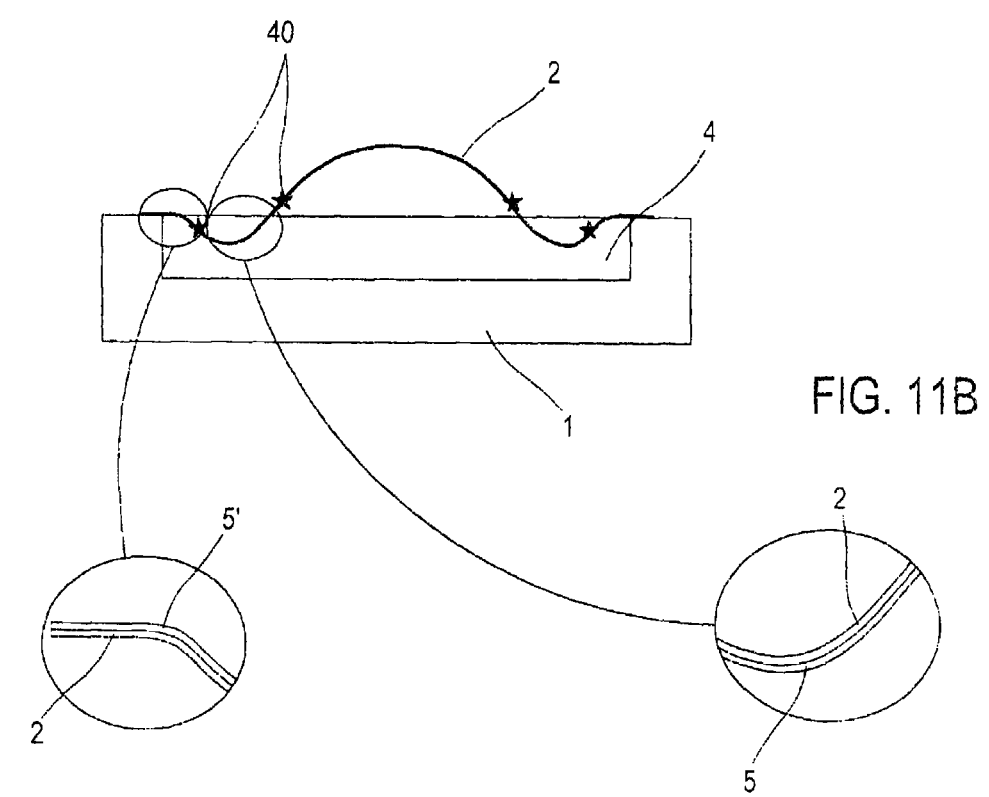

We will now explain how to obtain the deformation of the membrane 2, with reference to FIGS. 11A, 11B. The deformed shape of the membrane 2 shown in FIGS. 11A, 11B has two inflection points 40 in the radial direction in the intermediate zone 2.2.

These two inflection points 40 can be obtained using the principal actuation means 5 and the supplementary actuation means 5' as shown for example in FIG. 5A.

In FIG. 11A, the principal actuation means 5 and the supplementary actuation means 5' are on the same side of the membrane 2, in the example on the same side as the fluid 4 trapped between the membrane 2 and the support 1. During actuation, the electrodes associated with these actuation means are polarised oppositely to obtain different curvatures to the membrane 2. The piezoelectric actuator(s) of the principal actuation means 5 is (are) elongated in the radial direction and the piezoelectric actuator(s) of the supplementary actuation means 5' is (are) contracted in the radial direction. The same effect can be obtained by placing piezoelectric actuators of the principal actuation means 5 and the supplementary actuation means 5' on each side of the membrane 2 and by polarising the electrodes of the piezoelectric actuator(s) of one of the actuation means in the same way as the electrodes of the piezoelectric actuator(s) of the other actuation means. The piezoelectric actuators of the principal actuation means 5 and the supplementary actuation means 5' are deformed in the same way, either an elongation or a contraction on the radial direction.

In FIGS. 11A and 11B, the membrane 2 is shown as being a single layer, but of course it could be multi-layer, the actuation means described in FIG. 11A could be transposed in the configuration in FIG. 9F. Similarly, the actuation means described in FIG. 11B could be transposed in the configurations in FIG. 9G or 9H. The supplementary actuation means are not shown in these FIG. 12 to avoid cluttering the figures. Everything described in this figure obviously applies to an optical device according to the invention.

The support 1 may be monolithic as shown at the beginning of this description. As a variant shown in FIG. 12A, it could be formed by a frame 1.5 fixed to a plate 1.1 to form the dish 3. The plaque 1.1 materialises the bottom of the dish 3 which is transparent to optical radiation that will pass through it when the optical device operates in transmission or is reflecting when the optical device operates in reflection. There is no modification to the membrane 2 nor to the fluid 4 from what has been described above. The actuation means 5 are in the form of a single piezoelectric actuator arranged in a ring.

Figure 12A:
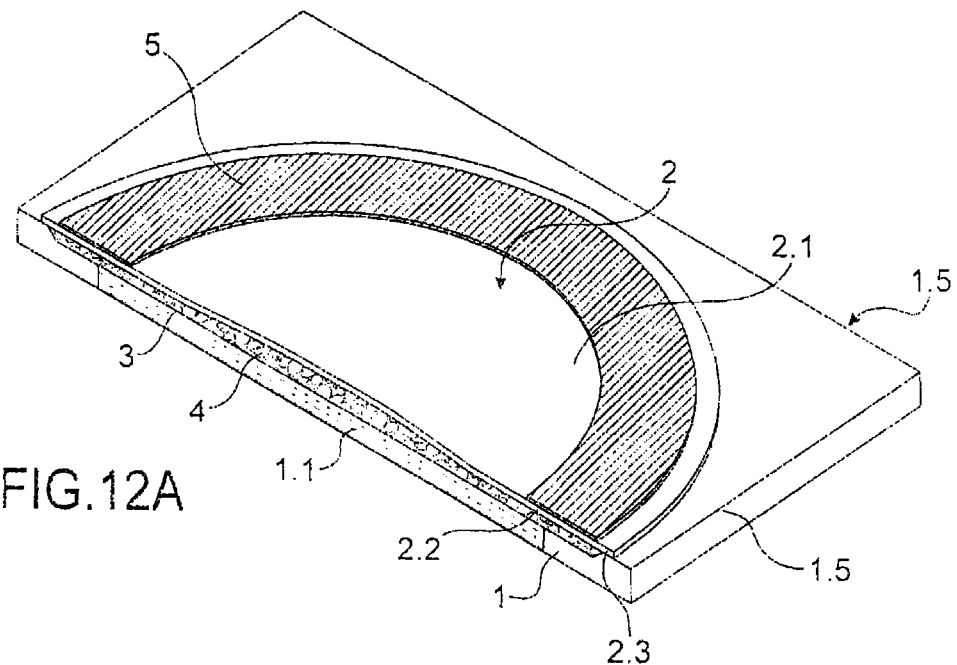
FIGS. 12A to 12E show different configurations of the support on which the membrane of an optical device according to the invention is anchored, only the principal actuation means being visible.
Figure 12B:
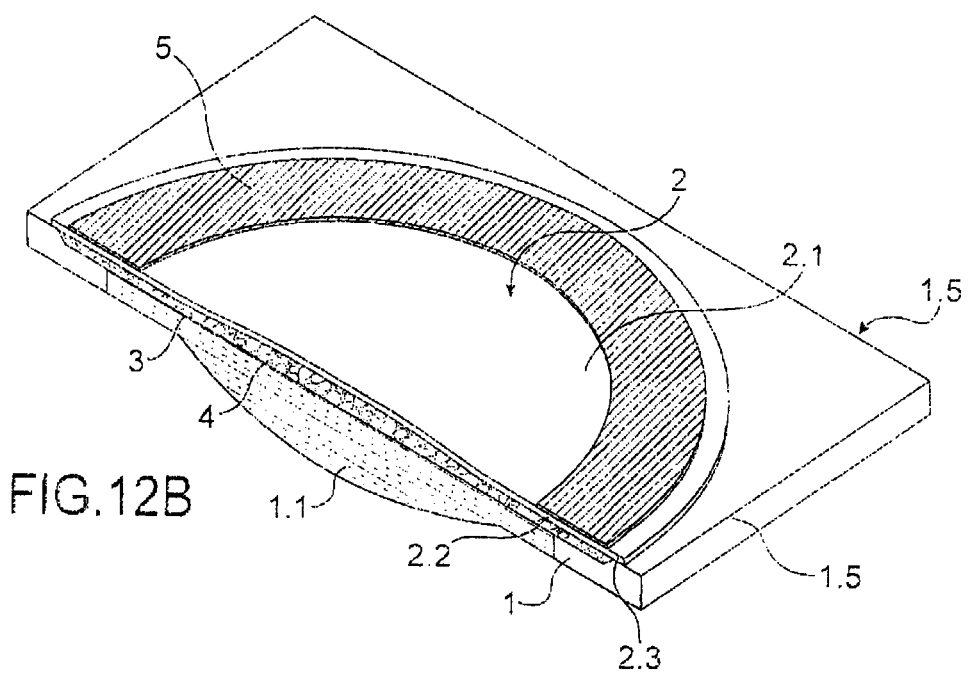
Figure 12C:
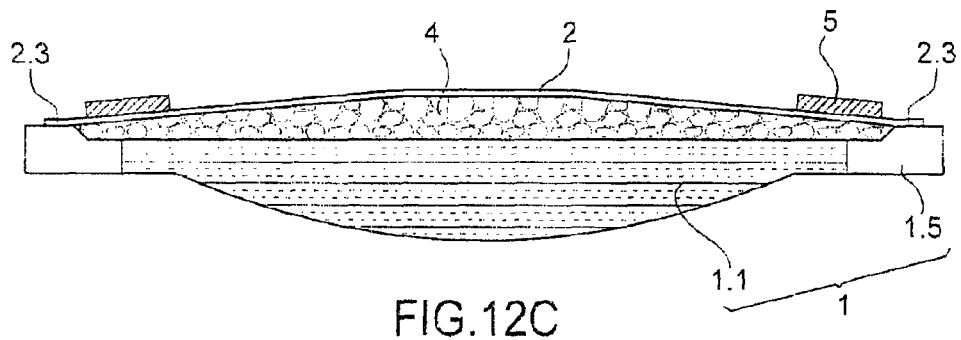
Figure 12D:
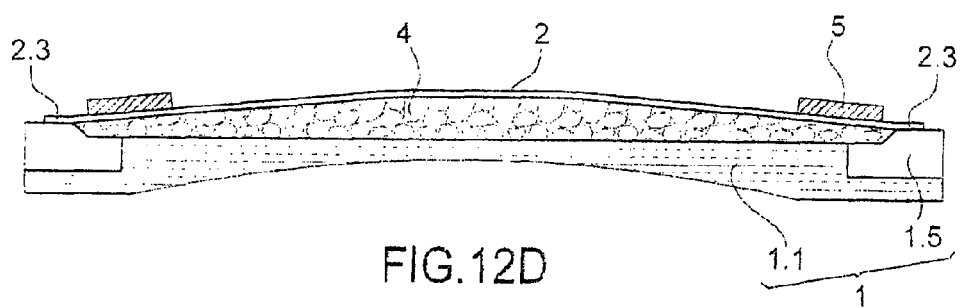

The transparent plate 1.1 may have an approximately constant thickness with approximately parallel plane faces as shown in FIG. 12A. At least one face could be structured as shown in FIGS. 12B, 12C, 12D, in which the outside face is convex or concave. The choice is made depending on the required optical performances for the optical device. It allows optical radiation to pass through the lens. The frame 1.5 may be made of a semi-conducting material like silicon, which makes it possible to integrate circuits associated with processing of the control of the actuation means 5. The circuits are not shown, to avoid cluttering the figures. The transparent plate 1.1 may be made of glass or plastic.

In FIGS. 12B, 12C, the transparent plate 1.1 has a convex structure and in FIG. 12D it has a concave structure. The structure of the transparent plate 1.1 may for example be obtained by machining or moulding.

Figure 12E:
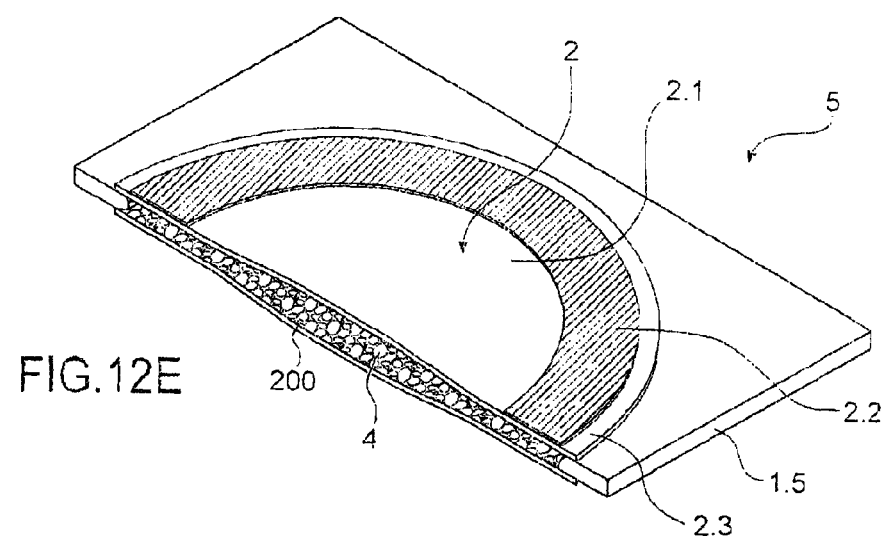

In FIG. 12E, the support 1 is materialised by the frame 1.5 and the transparent plate 1.1 is replaced by a second membrane 200. The second membrane 200 comprises a layer that has approximately the same surface as the first membrane 2. The two membranes 2, 200 are anchored onto the frame 1.5, each on one of its principal faces. They contribute to making a housing for the liquid 4. This increases the optical performances of the membrane 2. In the example described, the actuation means 5 are provided on only one of the membranes 2. The other membrane 200 is not actuated, but nevertheless it deforms when the actuation means 5 are actuated. As a variant, the two membranes could be actuated.

It is possible that the membrane 2 provided with the actuation means 5 is covered by a protective cap 201 sealed to the support 1 as shown in FIG. 9H. This cap 201 delimits a cavity.

For example, the attachment can be made by molecular bonding, by organic bonding, by anodic bonding, by eutectic bonding or an alloy layer for example made of Au/Si or Au/Sn, for example being inserted between the cap 201 and the support 1 to be sealed. These bonding techniques are currently used in the microelectronics industry and in microsystems.

The cap 201 delimits a cavity 6 inside which a second fluid 4' is trapped, the upper face of the membrane 2, in other words the face that is not in contact with the first fluid 4, is in contact with the second fluid 4'. At least the central part of the cap 201 and the second fluid 4' must be transparent to the incident optical radiation that will either be reflected onto the membrane 2, or will pass through it depending on the nature of the optical device.

The cap 201 may be made of glass or an organic material such as polyethylene terephthalate PET, polyethylene naphthalate, polymethyl methacrylate PMMA or polycarbonate PC if it is to transmit wavelengths in the visible. The cap 201 protects the membrane 2 because such optical devices with deformable membrane 2 are fragile objects that are difficult to manipulate.

The optical device may be made by techniques known in microelectronics. Thin layer deposition techniques such as chemical vapour phase deposition, physical vapour phase electro-deposition, epitaxy, thermal oxidation, evaporation and film lamination can be used. Organic materials or gel sol type materials may be deposited by sputtering with a spin coater. Moulding, embossing, heat embossing, nano impression techniques may be used to structure the lower face of the substrate as shown in FIGS. 12B to 12D. Bonding techniques may also be used to bond the membrane 2 to the support 1 or to bond a bottom 3 to the frame 1.5 or to bond cap 201 to the support 1, these techniques for example can be chosen from among direct bonding, eutectic bonding, anodic bonding, organic bonding. Thinning steps, for example by grinding, chemical thinning or a combination of the two types could be performed after bonding the bottom to the frame. The optical device can be manufactured in batches and all caps 201 of the different devices may be made collectively.

The membrane 2 may be made from organic materials such as polydimethylsiloxane, polymethyl methacrylate, le polyethylene terephthalate, polycarbonate, parylene, epoxy resins, photosensitive polymers, silicones like those known under the name SiNR by Shin-Etsu or WL5150 by Dow Corning or mineral materials such as silicon, silicon oxide, silicon nitride, silicon carbide, polycrystalline silicon, titanium nitride, diamond carbon, tin and indium oxide, aluminium, copper, nickel.

Each of the fluids 4, 4' may be a liquid like propylene carbonate, water, an index liquid, an optical oil or an ionic liquid or a gas for example such as air, nitrogen, helium.

The piezoelectric material of the actuation means 5, 5' may be chosen from among PZT or Lead Titano-Zirconate with formula $Pb(Zr_x,Ti_{1-x})O_3$, aluminium nitride AlN, polyvinylidene fluoride (PVDF) and its copolymers of trifluoroethylene (TrFE), zinc oxide ZnO, barium titanate $BaTiO_3$, lead niobate $PNbO_3$, bismuth titanate $Bi_4Ti_3O_{12}$ or other sillenites that are oxides with a metal/oxygen ratio equal to 2/3.

The deposition of a layer made of a piezoelectric material such as PZT requires hot annealing at about 800° C. Often, the material used in the membrane 2 will not resist these temperatures. Therefore, the first step is to make piezoelectric material actuation means and to assemble them to the membrane later. These constraints have to be taken into account when creating the stack during manufacturing of the optical device according to the invention.

The inventors realised that the focal distance of the optical device might change in unwanted manner because the different materials from which the optical device according to the invention is made do not have the same coefficient of thermal expansion.

Figure 13A:
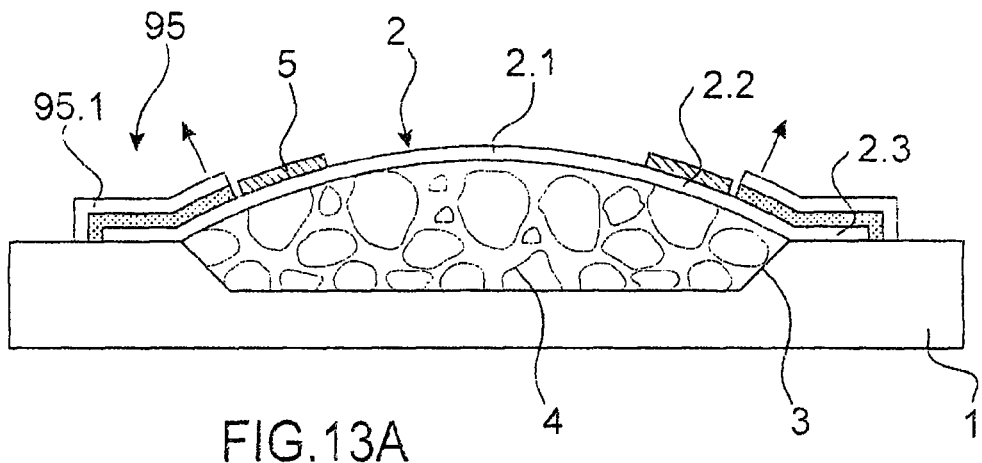
FIGS. 13A, 13B show an optical device according to the invention provided with means of compensating for a variation in its focal distance due to a temperature variation, the supplementary actuation means not being shown to avoid cluttering the figures.
Figure 13B:
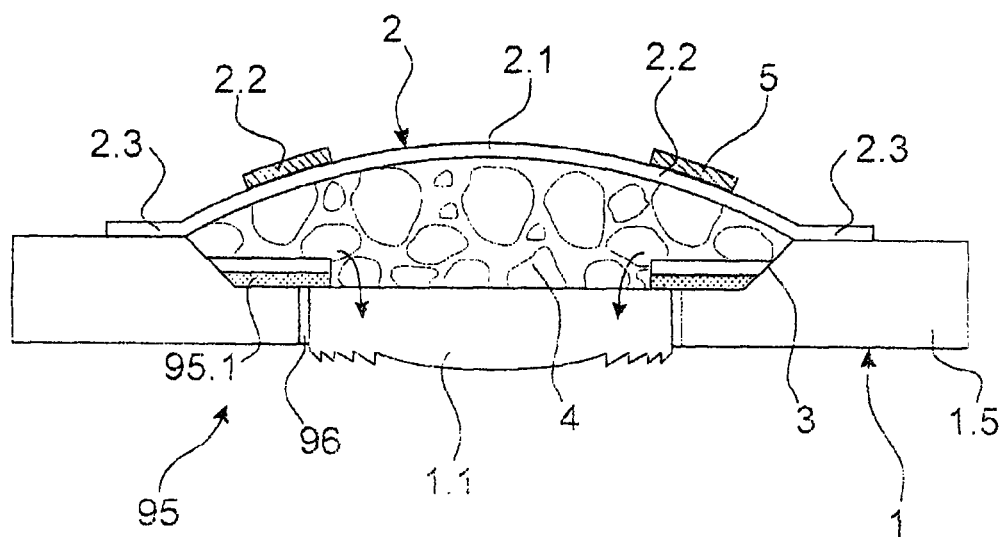

Therefore, means can be provided to compensate for a variation in the focal distance due to a temperature variation. Refer to FIGS. 13A, 13B.

These compensation means 95 are formed from one or several thermal bimorph elements 95.1 arranged in a ring, either at the membrane 2 at the anchor zone 2.3 projecting onto the intermediate zone 2.2 as shown in FIG. 13A, or at the bottom 3.1 of the dish 3 as shown in FIG. 13B. These bimorph elements 95.1 are dedicated to this compensation. Under the effect of an increase in the temperature that in particular causes an increase in the volume of the fluid 4 trapped between the membrane 2 and the support 1 and therefore unwanted deformation of the membrane 2, the bimorph elements 95.1 deform to increase the volume of the dish 3 by increasing its thickness. A bimorph element 95.1 formed from two superposed layers made from materials with different coefficients of thermal expansion will not cause any problem for those skilled in the art.

In the configuration shown in FIG. 13B, the support 1 is similar to the support shown in FIG. 12B. On the fluid side 4, the bimorph elements 95.1 are on the frame 1.5 and project onto the transparent plate 1.1. The central part of the transparent plate 1.1 is concave and it comprises striations at its periphery. An expansion joint 96 is inserted between the plate 1.1 and the frame 1.5 to give its flexibility along the optical axis and to enable an increase in the volume of the dish 3. The increase in the volume of the dish 3 will be due to the deformation of the membrane 2 around the edge of the anchor zone 2.3 and/or the support 1. The objective is that expansion of the fluid 4 trapped between the membrane 2 and the support 1 would not have any influence on the deflection of the membrane 2 in the central zone 2.1 and therefore on the focal distance of the optical device.

As a variant, the means 95 provided to compensate for a variation in the focal distance under the effect of a temperature variation can be made by the piezoelectric actuator(s) 5.1 arranged in at least one single ring of the principal actuation means 5 or supplementary actuation means 5'. For example, it could be the piezoelectric actuator arranged according to the ring Cint in FIG. 6B.

The next step is to make blocks of the piezoelectric actuators made from piezoelectric materials as stacks of several piezoelectric materials with appropriate coefficients of thermal expansion such that within the range of working temperatures of the optical device, for example −20° C. to +60° C., the blocks of piezoelectric material offset the thermal expansion of the other materials in the optical device, namely the support 1, possibly the cap if there is one and the other block(s) of piezoelectric material, the first fluid 4 and the second fluid 4' and of course the membrane 2. Of course, this compensation will be made without applying an electric field to the block(s) of piezoelectric material concerned.

It would also be possible that the means 95 for compensating a variation of the focal distance under the effect of a temperature variation could contribute to ensuring that the residual stress applied to the membrane 2 remains approximately constant, regardless of the climatic conditions. This thus avoids the development of buckling or crimpling of the membrane 2 in the case of an excessive compressive stress or an excessive tension stress that would have the effect of degrading the performances of the optical device.

The material(s) in the membrane 2 is (are) chosen to satisfy the requirements of the manufacturing method or so that the liquid lens or the mirror achieves specific performances.

The efficiency of the optical device is better for a given energy consumption if its central zone 2.1 is more flexible. A silicone organic material is particularly suitable. It is then preferable that the membrane should be made stiffer at the intermediate zone by providing the reinforcement layer, for example made of a mineral material such as silicon oxide and/or silicon nitride on the organic layer extending from the central zone to at least the intermediate zone or even as far as the anchor zone. A membrane for which the central zone 2.1 is made of silicon oxide or silicon nitride would also be suitable.

It will also be arranged such that the actuation means once fixed on the membrane 2 do not disturb the expected behaviour of the membrane 2. The deformed shape of the membrane 2 at rest must be compatible with the required use of the optical device. At rest, the membrane 2 may form an approximately plane, or concave or convex dioptre.

It will also be arranged such that the membrane at rest is subject to a sufficiently low residual compression stress that does not cause any crimpling or buckling. Similarly, at rest, the membrane tension stress must be sufficiently low so that it can react efficiently to actuation of the actuation means, which would not be the case if excessive tension were applied to it. Therefore a compromise has to be found between tension and compression stresses.

The reinforcement layer must be sufficient stiff to apply the pressure applied by the actuation means onto the fluid trapped between the membrane and the support, and therefore generate the required fluid displacements. A list of materials that could be used for the reinforcement layer is given below. They could be metallic materials such as titanium, titanium nitride, aluminium of the order of few tens of nanometers to a few micrometers thick for which the Young's modulus is between a few tens of GPa and a few hundred GPa. It could be materials such as silicon oxide, silicon nitride with a thickness of the order of a few tens of nanometers to a few micrometers and for which the Young's modulus is between a few tens of GPa to a few hundred GPa. Finally, it may consist of organic materials such as photosensitive polymers and particularly benzocyclobutenes (BCB) with a thickness of few micrometers and for which the Young's modulus is a few GPa.

We will now consider an example of a manufacturing method of an optical device with variable focal distance according to the invention. We will use a sacrificial layer. Refer to FIGS. 14A to 14G.

Figure 14A:
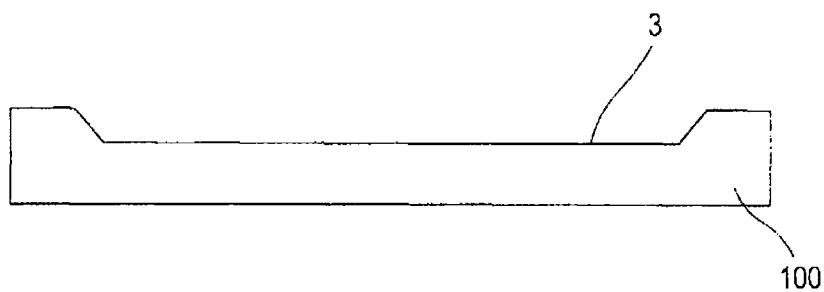
FIGS. 14A to 14G show different steps in manufacturing an optical device useful for understanding the invention.
Figure 14B:
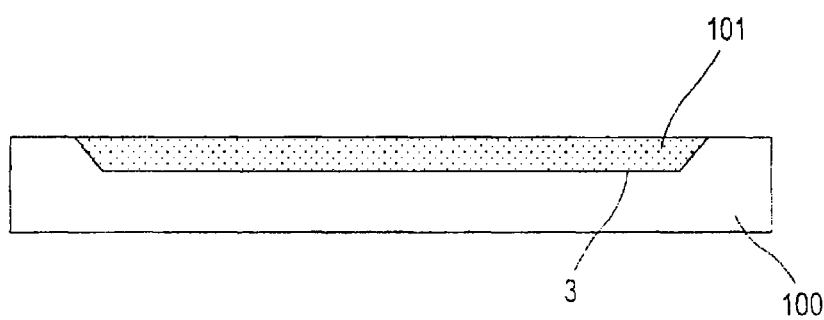

The starting point is a substrate 100 in which a dish 3 was etched. The substrate 100 may for example be made of glass (FIG. 14A). It forms the support. A sacrificial material 101 is deposited in the dish 3 (FIG. 14B). The sacrificial material 101 may be organic, for example a photosensitive resin, or a mineral material such as silicon oxide.

Figure 14C:
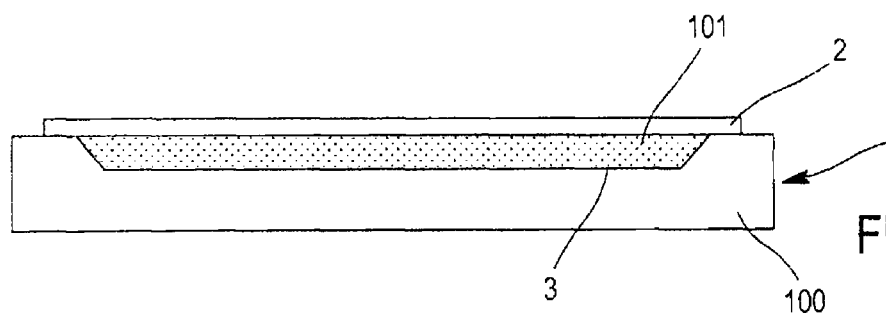

The membrane 2 is formed on the sacrificial material 101, such that it projects over the edge of the dish 3 and is anchored to it (FIG. 14C). A material chosen from the materials listed above could be deposited for the membrane 2. The deposit can be made with a spin coater or by chemical vapour phase deposition.

Figure 14D:
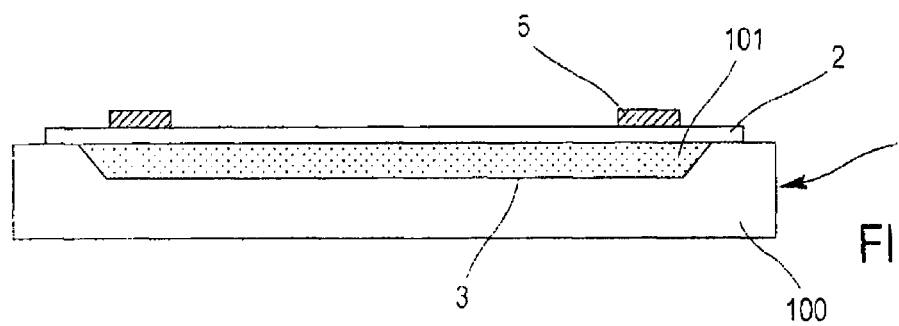
Figure 14E:
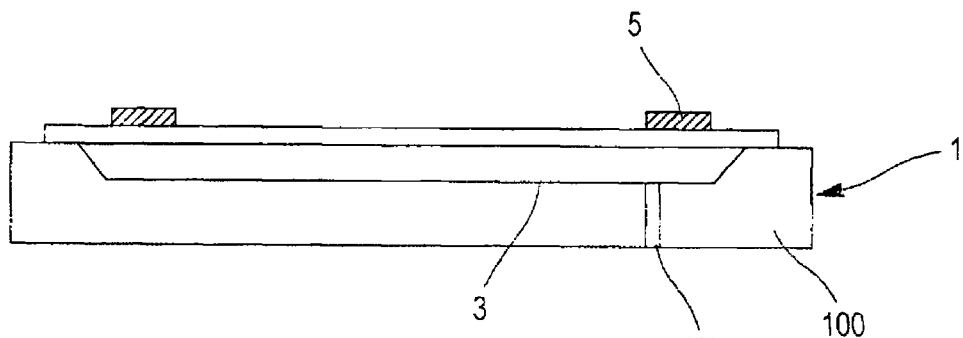
Figure 14F:
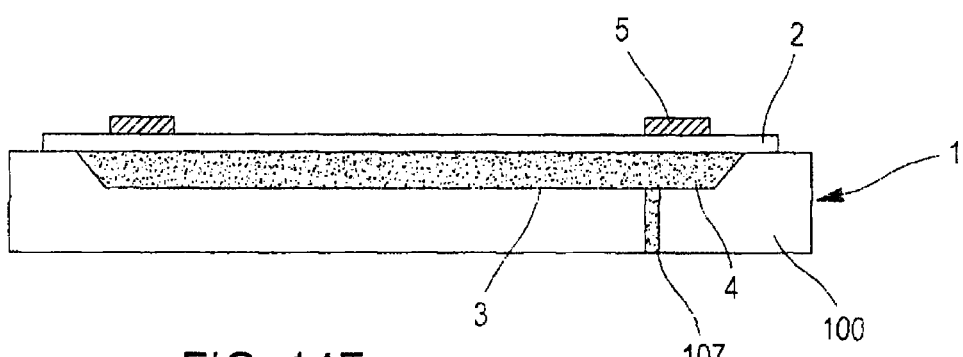
Figure 14G:
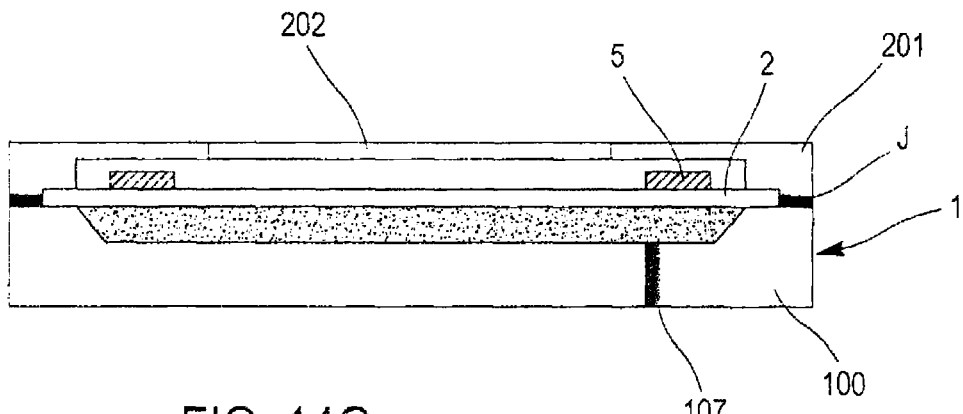

The next step is to form the actuation means 5 at the contactless intermediate zone with the support 1 (FIG. 14D). They are deposited by techniques used in micro-systems such as thin layer deposition, lithography, etching. The next step is to release the membrane 2 by eliminating the sacrificial material. This can be done by drilling at least one hole 107 outside the optical field (central zone), in the substrate 100 until the sacrificial material 101 is reached. The hole 107 passes through and opens up into the dish 3 (FIG. 14E). The elimination may be chemical or thermal or it may be by oxygen plasma. The dish 3 is then filled with the fluid 4 (FIG. 14F). Filling may be done by applying a negative pressure to the dish 3 to facilitate penetration of fluid 4 and to prevent the formation of bubbles in the case of a liquid. Finally the hole 107 is closed off so that the fluid 4 cannot escape (FIG. 14F). An organic material could be used. The order of steps is not limitative.

The main actuation means 5 could also be formed for example after the membrane 2 has been released, before or after filling. They could also be formed on the sacrificial layer 101 before the membrane 2 is formed, if they are eventually to be on the side of the fluid 4 trapped between the support 1 and the membrane 2. In such a configuration, the membrane 2 is superjacent to the actuation means 5. The supplementary actuation means could, of course, be formed in the same way as the principal actuation means. They are not shown in FIG. 12 to avoid cluttering the figures.

If it required that the membrane 2 at rest should be curved, concave or convex, an appropriate curvature is given to the free face of the sacrificial layer 101, because it acts as a mould for the membrane 2. Another solution for obtaining a curved membrane 2 would be to make it buckle after releasing it. Buckling could be thermal. The controlling parameters are then the difference between the coefficients of thermal expansion of the membrane 2 and the substrate and the deposition temperature of the membrane 2.

The membrane 2 could be protected by making the optical device according to the invention by assembling a support 1 and a cap 201 as described in FIG. 9H. There is no need for the cap 201 to be solid, and in FIG. 14G it is recessed in its central part, and the opening is marked as reference 202. A glue seal J is used to assemble the support 1 and the cap 201.

Figure 15A:
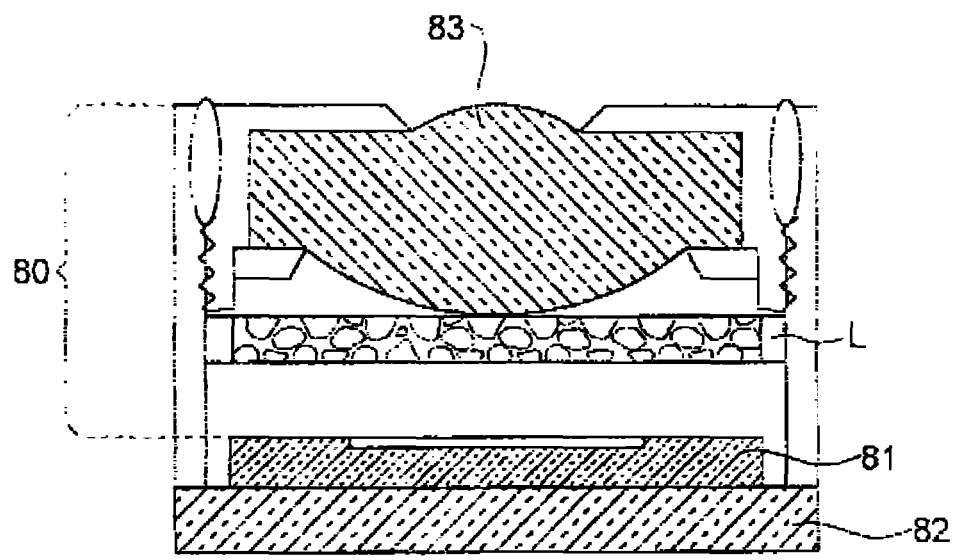
FIGS. 15A, 15B show an optical device according to the invention mounted in a camera.

Such an optical device with variable focal distance can be used in a camera, and particularly a portable telephone camera. Refer to FIG. 15A. Such a camera comprises in cascade, an objective 80 including at least one liquid lens type of optical device with variable focal distance L according to the invention, an image sensor 81 for example of the CCD or CMOS type supported on a substrate 82. In the example described, the objective 80 comprises at least one lens 83 with fixed focal distance and a liquid lens L according to the invention. In the following, this lens with fixed focal distance 83 will be called the conventional optical block. The liquid lens L is located between the conventional optical block 83 and the image sensor 81. As a variant, the conventional optical block 83 may be between the liquid lens L and the image sensor 81. The conventional optical block 83 is static. As we have already seen, due to its manufacturing method, the liquid lens L may be considered to be a MOEMS (micro-optoelectromechanical system). The liquid lens L with variable focal length is placed at a certain distance that depends on the characteristics of the objective 80, the image sensor 81, but if this distance is small, the liquid lens L and the image sensor 81 must be made as a single component by integrating them using either the AIC (Above Integrated Circuit) technology or the WLCSP (Wafer Level Chip Scale Package) technology. The focal distance of the liquid lens L is adapted by optimising the pressure of the liquid at rest but also the curvature of the membrane 2 at rest and the liquid refraction index.

Figure 15B:
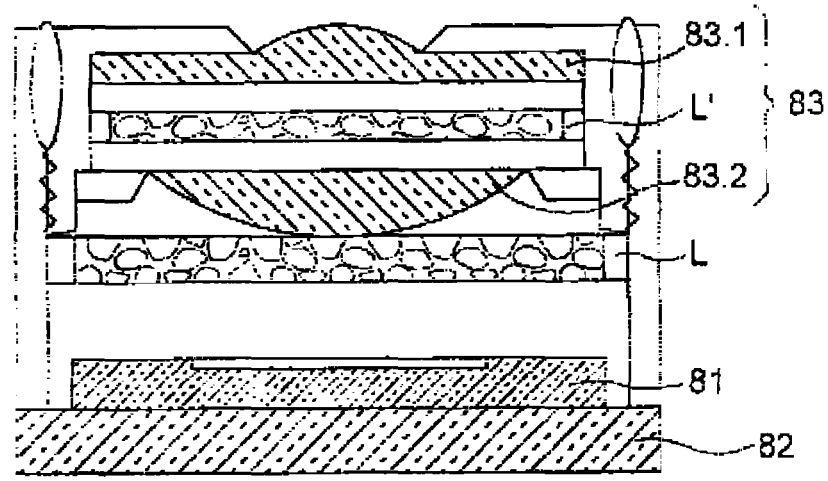

If the camera also includes a zoom function as shown in FIG. 15B, an optical block 83 with at least two fixed focal length lenses 83.1, 83.2 and two liquid lenses L and L' will be used, one of which will be between the two lenses 83.1, 83.2 of the optical block 83 and the other close to the image sensor 81 as shown in FIG. 15B. In these FIGS. 15A, 15B, the optical devices according to the invention references L and L' are represented very diagrammatically, their actuation means are not shown.

With a given size of an optical device according to the invention, the surface of the actuation means can be maximised by using several piezoelectric actuators arranged in several rings. The energy provided by the actuation means may be maximised, to either improve fluid displacements and therefore the performances of the optical device with constant power supply voltage, or to minimise the power supply voltage for equivalent optical performances.

Configurations with several piezoelectric actuator rings at least one of which comprises a single piezoelectric actuator and at least one of which comprises several elementary piezoelectric actuators, can give a high actuation power due to the single piezoelectric actuator in one of the rings, and a non-axisymmetric deformation due to the elementary piezoelectric actuators in another ring.

By anchoring the principal actuation means only to the membrane in the intermediate zone, the size of the device can be made smaller than would be possible with the configurations in which the actuation means are anchored to the support.

Providing means of compensating for a variation of the focal distance due to a temperature variation makes it possible to keep the focal distance of the device constant regardless of the temperature, within a given range.

Although several embodiments of this invention have been described in detail, it will be understood that different changes and modifications can be made without going outside the framework of the invention, and particularly other methods could be used to make the membrane and the actuation means.

The invention claimed is:
1. An optical device comprising:
a deformable membrane including an anchor zone on a support to contribute to trapping a quantity of liquid or gaseous fluid, a central zone to reversibly deform from a rest position, and an intermediate zone between the anchor zone and the central zone;
a principal piezoelectric actuator arranged in a first ring in the intermediate zone so as to be mounted around the central zone, the principal piezoelectric actuator including one or more piezoelectric actuator elements; and
a supplementary piezoelectric actuator arranged in a second ring shape in the intermediate zone so as to be mounted around the central zone and so as to encircle the principal piezoelectric actuator, the supplementary piezoelectric actuator including one or more piezoelectric actuator elements, wherein
the principal piezoelectric actuator is anchored only to the intermediate zone of the membrane,
the supplementary piezoelectric actuator is anchored to the intermediate zone and to the support,
the principal piezoelectric actuator, the supplementary piezoelectric actuator, and the membrane to which they are anchored form at least a piezoelectric bimorph,
the principal piezoelectric actuator and the supplementary piezoelectric actuator are to contract or expand in a radial direction of the rings during actuation so as to generate a displacement of the fluid from the intermediate zone to the central zone of the membrane or vice versa to deform the central zone relative to its rest position, and the principal piezoelectric actuator and the supplementary piezoelectric actuator each act on different portions of the membrane in the radial direction during actuation.

2. The optical device according to claim 1, wherein the principal piezoelectric actuator and the supplementary piezoelectric actuator can be actuated independently, simultaneously, or successively.

3. The optical device according to claim 1, wherein the principal and/or supplementary piezoelectric actuators include one or more piezoelectric actuator elements arranged in a plurality of rings centered around the central zone that are concentric to each other.

4. The optical device according to claim 1, wherein the principal and/or the supplementary actuator includes a single piezoelectric actuator element in a form of a continuous ring.

5. The optical device according to claim 1, wherein the one or more piezoelectric actuator elements of the first or second ring are in a form of ring sectors or rods oriented in the radial direction with intervals between each other, the ring being in pieces or continuous.

6. The optical device according to claim 5, wherein plural piezoelectric actuator elements of a single ring or nearby rings share a same block of piezoelectric material.

7. The optical device according to claim 1, wherein the principal or supplementary piezoelectric actuator is anchored to a face of the membrane in contact with the fluid, a face of the membrane that is not in contact with the fluid, and/or integrated in the membrane.

8. The optical device according to claim 1, wherein the membrane comprises a reinforcement layer at the intermediate zone, at least locally, such that the intermediate zone at the reinforcement layer is stiffer than the central zone.

9. The optical device according to claim 1, wherein the membrane comprises a continuous layer at the central zone that occupies the intermediate zone and the anchor zone.

10. The optical device according to claim 1, further comprising means for compensating for a variation of focal distance of the optical device as a function of temperature.

11. The optical device according to claim 10, wherein the compensation means is coincident with the one or more piezoelectric actuator elements of a ring.

12. The optical device according to claim 10, wherein the compensation means comprises one or plural thermal bimorph elements arranged in a ring either anchored to the membrane at the anchor zone projecting on the intermediate zone, or fixed to the support on a side of the membrane opposite the fluid.

13. The optical device according to claim 1, wherein the one or more piezoelectric actuator elements of the principal and/or supplementary piezoelectric actuator(s) are arranged in a ring with an internal periphery and an external periphery, the ring extending over one of its peripheries by piezoelectric actuator elements in bars oriented in the radial direction.

14. The optical device according to claim 1, further comprising one or plural piezoelectric actuators arranged in a ring, anchored to the membrane in the intermediate zone and/or in the anchor zone, that are to operate passively by direct piezoelectric effect to monitor a deformation of the membrane.

15. The optical device according to claim 1, further comprising a protective cap fixed to the support.

16. The optical device according to claim 15, wherein the cap includes an opening at the central zone or is leak tight and traps another fluid.

17. The optical device according to claim 1, wherein the membrane is made based on organic materials chosen from among polydimethylsiloxane, polymethyl methacrylate, polyethylene terephthalate, polycarbonate, parylene, epoxy resins, photosensitive polymers, silicones, based on mineral materials chosen from among silicon, silicon oxide, silicon nitride, silicon carbide, polycrystalline silicon, titanium nitride, diamond carbon, tin and indium oxide, aluminium, copper, and nickel.

18. The optical device according to claim 1, wherein the fluid is a liquid chosen from among propylene carbonate, water, an index liquid, an optical oil, and an ionic liquid or a gas chosen from among air, nitrogen, and helium.

19. The optical device according to claim 1, wherein a piezoelectric material of the principal piezoelectric actuator and/or the supplementary piezoelectric actuator is made based on PZT, aluminium nitride, polyvinylidene fluoride or one of its copolymers, trifluoroethylene, trifluoroethylene, zinc oxide, barium titanate, lead niobate, sillenites, or bismuth titanate.

20. The optical device according to claim 1, wherein the optical device forms a lens or a mirror.

21. A camera that includes at least one optical device, comprising:
a deformable membrane including an anchor zone on a support to contribute to trapping a quantity of liquid or gaseous fluid, a central zone to reversibly deform from a rest position, and an intermediate zone between the anchor zone and the central zone;
a principal piezoelectric actuator arranged in a first ring in the intermediate zone so as to be mounted around the central zone, the principal piezoelectric actuator including one or more piezoelectric actuator elements; and
a supplementary piezoelectric actuator arranged in a second ring shape in the intermediate zone so as to be mounted around the central zone and so as to encircle the principal piezoelectric actuator, the supplementary piezoelectric actuator including one or more piezoelectric actuator elements, wherein
the principal piezoelectric actuator is anchored only to the intermediate zone of the membrane,
the supplementary piezoelectric actuator is anchored to the intermediate zone and to the support,
the principal piezoelectric actuator, the supplementary piezoelectric actuator, and the membrane to which they are anchored form at least a piezoelectric bimorph,
the principal piezoelectric actuator and the supplementary piezoelectric actuator are to contract or expand in a radial direction of the rings during actuation so as to generate a displacement of the fluid from the intermediate zone to the central zone of the membrane or vice versa to deform the central zone relative to its rest position, and
the principal piezoelectric actuator and the supplementary piezoelectric actuator each act on different portions of the membrane in the radial direction during actuation.

22. An optical device comprising:
a deformable membrane including an anchor zone on a support to contribute to trapping a quantity of liquid or gaseous fluid, a central zone to reversibly deform from a rest position, and an intermediate zone between the anchor zone and the central zone;
a principal piezoelectric actuator arranged in a first ring in the intermediate zone so as to be mounted around the central zone, the principal piezoelectric actuator including one or more piezoelectric actuator elements; and
a supplementary piezoelectric actuator arranged in a second ring in the intermediate zone so as to be mounted around the central zone and so as to encircle the principal piezoelectric actuator, the supplementary piezoelectric actuator including one or more piezoelectric actuator elements, wherein the principal piezoelectric actuator is anchored only to the intermediate zone of the membrane, the supplementary piezoelectric actuator is anchored only to the intermediate zone of the membrane, the principal piezoelectric actuator, the supplementary piezoelectric actuator, and the membrane to which they are anchored form at least a piezoelectric bimorph, the principal piezoelectric actuator and the supplementary piezoelectric actuator are to contract or expand in a radial direction of the rings during actuation so as to generate a displacement of the fluid from the intermediate zone to the central zone of the membrane or vice versa to deform the central zone relative to its rest position, the principal piezoelectric actuator and the supplementary piezoelectric actuator each act on different portions of the membrane in the radial direction during actuation, a quantity of fluid trapped between the support and the central and intermediate zones of the membrane is approximately constant, and the central zone is actuatorless.

23. The optical device according to claim 22, wherein the principal piezoelectric actuator and the supplementary piezoelectric actuator can be actuated independently, simultaneously, or successively.

24. The optical device according to claim 22, wherein the principal and/or supplementary piezoelectric actuators include one or more piezoelectric actuator elements arranged in a plurality of rings centered around the central zone that are concentric to each other.

25. The optical device according to claim 22, wherein the principal and/or the supplementary actuator includes a single piezoelectric actuator element in a form of a continuous ring.

26. The optical device according to claim 22, wherein the one or more piezoelectric actuator elements of the first or second ring are in a form of ring sectors or rods oriented in the radial direction with intervals between each other, the ring being in pieces or continuous.

27. The optical device according to claim 26, wherein plural piezoelectric actuator elements of a single ring or nearby rings share a same block of piezoelectric material.

28. The optical device according to claim 22, wherein the principal or supplementary piezoelectric actuator is anchored to a face of the membrane in contact with the fluid, a face of the membrane that is not in contact with the fluid and/or integrated in the membrane.

29. The optical device according to claim 22, wherein the membrane comprises a reinforcement layer at the intermediate zone, at least locally, such that the intermediate zone at the reinforcement layer is stiffer than the central zone.

30. The optical device according to claim 22, wherein the membrane comprises a continuous layer at the central zone that occupies the intermediate zone and the anchor zone.

31. The optical device according to claim 22, further comprising:
means for compensating for a variation of focal distance of the optical device as a function of temperature.

32. The optical device according to claim 31, wherein the compensation means is coincident with the one or more piezoelectric actuator elements of a ring.

33. The optical device according to claim 31, wherein the compensation means comprises one or plural thermal bimorph elements arranged in a ring either anchored to the membrane at the anchor zone projecting on the intermediate zone, or fixed to the support on a side of the membrane opposite the fluid.

34. The optical device according to claim 22, wherein the one or more piezoelectric actuator elements of the principal and/or supplementary piezoelectric actuator(s) are arranged in a ring with an internal periphery and an external periphery, the ring extending over one of its peripheries by piezoelectric actuator elements in bars oriented in the radial direction.

35. The optical device according to claim 22, further comprising:
one or plural piezoelectric actuators arranged in a ring, anchored to the membrane in the intermediate zone or in the intermediate zone and in the anchor zone, that are to operate passively by direct piezoelectric effect and to monitor a deformation of the membrane.

36. The optical device according to claim 22, further comprising:
a protective cap fixed to the support, the cap including an opening at the central zone or being leak tight and trapping another fluid.

37. The optical device according to claim 22, wherein the optical device forms a lens or a minor.

38. A camera, comprising:
at least one deformable membrane including an anchor zone on a support to contribute to trapping a quantity of liquid or gaseous fluid, a central zone to reversibly deform from a rest position, and an intermediate zone between the anchor zone and the central zone;

a principal piezoelectric actuator arranged in a first ring in the intermediate zone so as to be mounted around the central zone, the principal piezoelectric actuator including one or more piezoelectric actuator elements; and a supplementary piezoelectric actuator arranged in a second ring in the intermediate zone so as to be mounted around the central zone and so as to encircle the principal piezoelectric actuator, the supplementary piezoelectric actuator including one or more piezoelectric actuator elements, wherein the principal piezoelectric actuator is anchored only to the intermediate zone of the membrane, the supplementary piezoelectric actuator is anchored only to the intermediate zone of the membrane, the principal piezoelectric actuator, the supplementary piezoelectric actuator, and the membrane to which they are anchored form at least a piezoelectric bimorph, the principal piezoelectric actuator and the supplementary piezoelectric actuator are to contract or expand in a radial direction of the rings during actuation so as to generate a displacement of the fluid from the intermediate zone to the central zone of the membrane or vice versa to deform the central zone relative to its rest position, the principal piezoelectric actuator and the supplementary piezoelectric actuator each act on different portions of the membrane in the radial direction during actuation, a quantity of fluid trapped between the support and the central and intermediate zones of the membrane is approximately constant, and the central zone is actuatorless.

* * * * *